US008372668B2

(12) United States Patent
Hatano et al.

(10) Patent No.: US 8,372,668 B2
(45) Date of Patent: Feb. 12, 2013

(54) LIGHT-EMITTING DEVICE AND METHOD FOR MANUFACTURING THE SAME

(75) Inventors: Kaoru Hatano, Kanagawa (JP); Takaaki Nagata, Kanagawa (JP); Takuya Tsurume, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 281 days.

(21) Appl. No.: 12/729,487

(22) Filed: Mar. 23, 2010

(65) Prior Publication Data

US 2010/0248403 A1    Sep. 30, 2010

(30) Foreign Application Priority Data

Mar. 26, 2009   (JP) ................. 2009-075989

(51) Int. Cl.
*H01L 21/00*   (2006.01)
(52) U.S. Cl. ....... 438/22; 438/28; 438/29; 257/E51.022; 257/E27.119
(58) Field of Classification Search .............. 438/28, 438/29, 22; 257/E51.022, E25.032, E27.119
See application file for complete search history.

(56) References Cited

U.S. PATENT DOCUMENTS

| | | | |
|---|---|---|---|
| 6,844,672 B2 | 1/2005 | Yamazaki | |
| 6,946,361 B2 * | 9/2005 | Takayama et al. | 438/455 |
| 7,037,157 B2 | 5/2006 | Murakami et al. | |
| 7,449,351 B2 * | 11/2008 | Yamada | 438/29 |
| 7,473,928 B1 | 1/2009 | Yamazaki et al. | |
| 7,579,203 B2 | 8/2009 | Yamazaki et al. | |
| 2007/0029554 A1 | 2/2007 | Nakamura et al. | |
| 2009/0072711 A1 * | 3/2009 | Cina et al. | 313/504 |
| 2009/0114926 A1 * | 5/2009 | Yamazaki | 257/79 |

FOREIGN PATENT DOCUMENTS

| | | |
|---|---|---|
| JP | 2003-92191 | 3/2003 |
| JP | 2003-163337 | 6/2003 |
| JP | 2004-71558 | 3/2004 |
| JP | 2007-67381 | 3/2007 |

* cited by examiner

*Primary Examiner* — Michael Trinh
(74) *Attorney, Agent, or Firm* — Husch Blackwell LLP

(57) ABSTRACT

In a manufacturing method of a light-emitting device, a separation layer is formed over a substrate; a semiconductor circuit element layer and first electrodes are formed over the separation layer; a partition wall overlapping with end portions of the first electrodes is formed; and organic material layers are formed over the first electrodes. Organic material layers emitting light of the same color are arranged adjacent to each other in a line and extend in a first direction. A second electrode is formed using a material having high adhesiveness to the partition wall over the organic material layers to be in contact with the partition wall. A stack structure including the semiconductor circuit element layer, the first electrodes, the partition wall, the organic material layers, and the second electrode is separated from the substrate using the separation layer in a second direction perpendicular to the first direction.

14 Claims, 17 Drawing Sheets

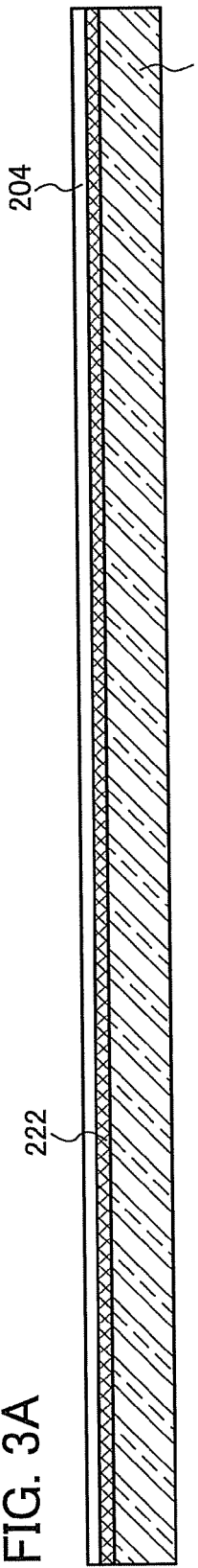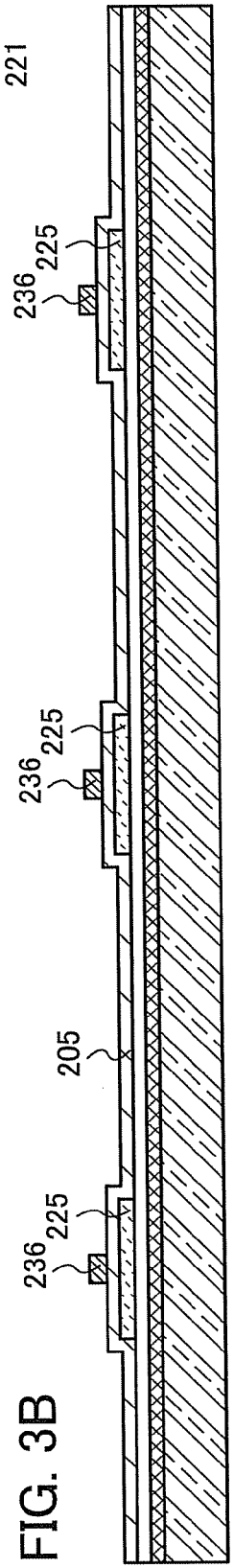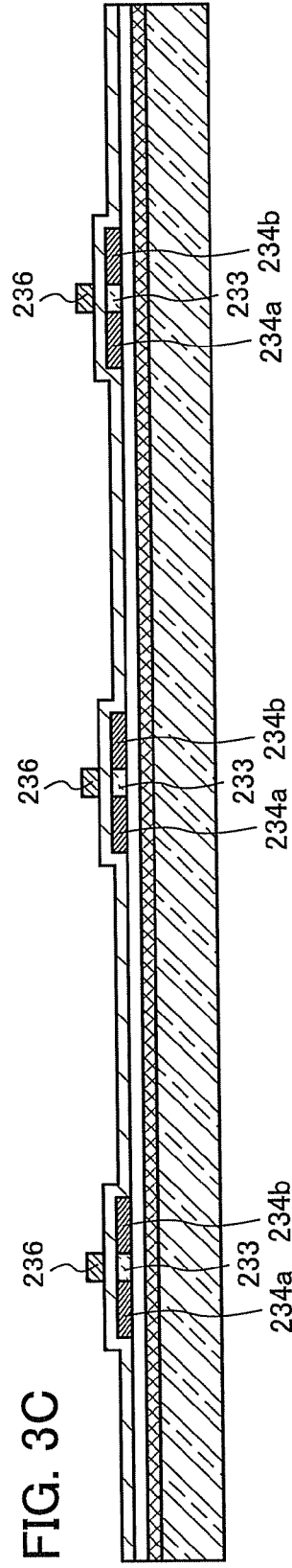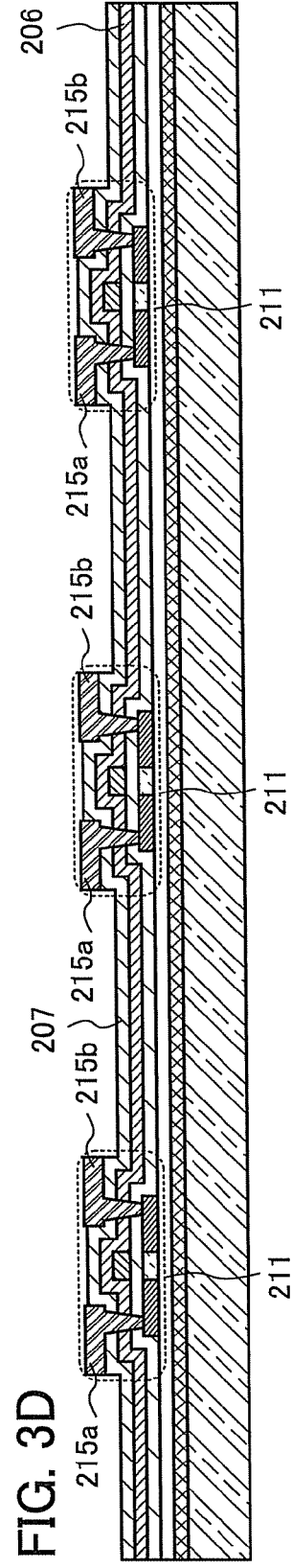

FIG. 14A
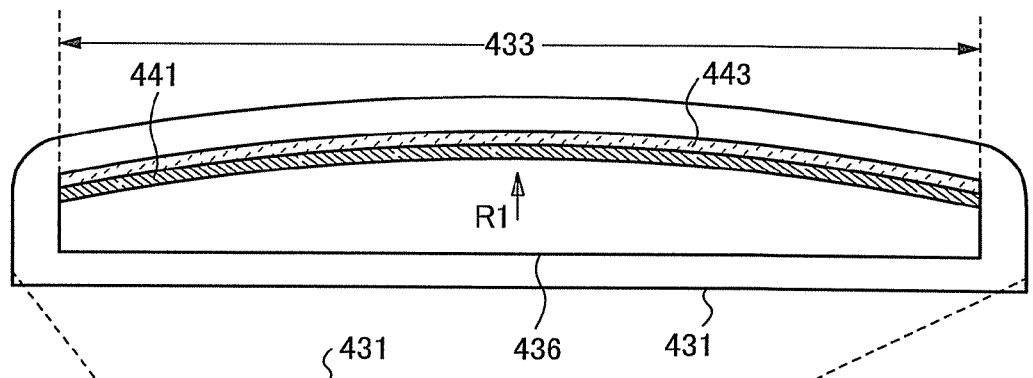
FIG. 14B
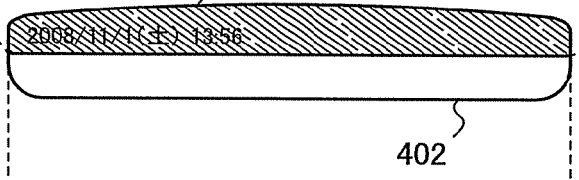
FIG. 14C
FIG. 14D
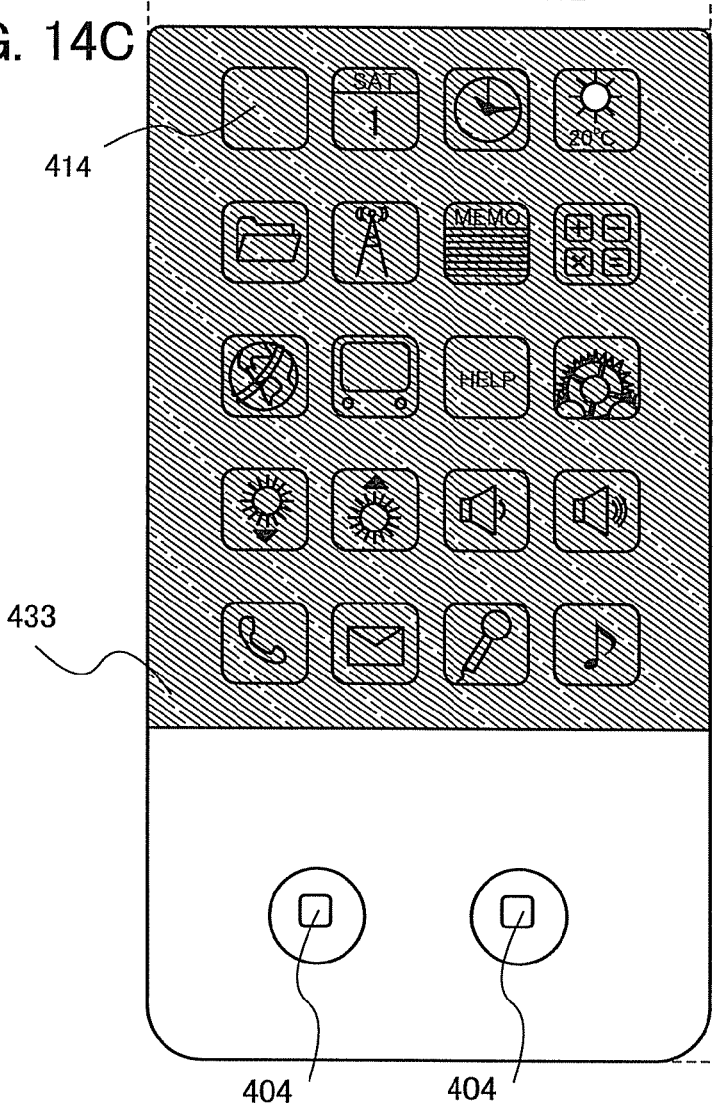
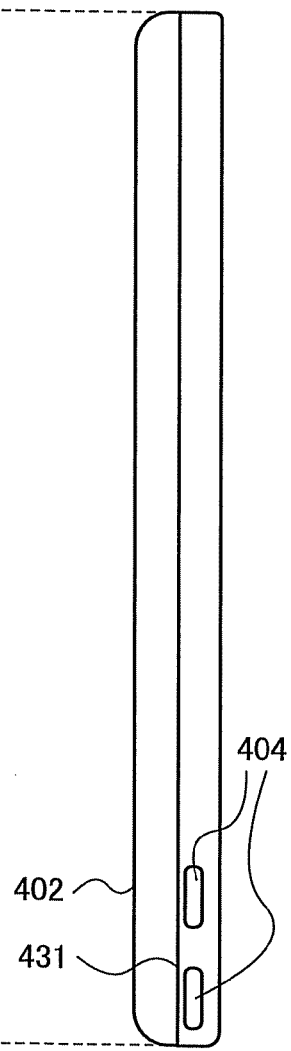

LIGHT-EMITTING DEVICE AND METHOD FOR MANUFACTURING THE SAME

BACKGROUND OF THE INVENTION

1. Field of the Invention

The present invention relates to a light-emitting device and a method for manufacturing the light-emitting device.

2. Description of the Related Art

A light-emitting device including a light-emitting element is manufactured in such a manner that a semiconductor circuit for driving a light-emitting element is formed over a substrate such as a glass substrate by using a semiconductor process, an insulating film (planarizing film) is formed over the semiconductor circuit, and a light-emitting element is formed over the insulating film.

In addition, there is a method for manufacturing a flexible light-emitting device, in which a separation layer is formed over a substrate such as a glass substrate, a semiconductor circuit element for driving a light-emitting element is formed over the separation layer, an insulating film (planarizing film) is formed over the semiconductor circuit element, a light-emitting element is formed over the insulating film, the semiconductor circuit element is separated from the substrate using the separation layer, and the semiconductor circuit element and the light-emitting element are transferred to a flexible substrate (Patent Document 1).

In Patent Document 1, an interlayer insulating film is formed over the light-emitting element including an anode, an organic light-emitting layer, and a cathode, and the interlayer insulating film is attached to a supporting member using an adhesive layer. Further, by using a first material layer and a second material layer each used as the separation layer, the semiconductor circuit element and the light-emitting element are separated from the substrate. The separated semiconductor circuit element and light-emitting element are attached to a film substrate using an adhesive layer.

REFERENCE

Patent Document

[Patent Document 1]
Japanese Published Patent Application No. 2003-163337

SUMMARY OF THE INVENTION

In the case where the adhesiveness of an organic layer and an electrode which is a cathode or an anode formed over the organic layer is low, separation could possibly occur at the interface between the electrode and the organic layer when a semiconductor circuit element and a light-emitting element are separated from a substrate using a separation layer.

Therefore, it is an object of an embodiment of the present invention to suppress separation at the interface between an electrode and an organic layer when a semiconductor circuit element and a light-emitting element are separated from a substrate using a separation layer.

When a light-emitting element is formed in each of a plurality of pixels included in a light-emitting device, a region where a partition wall is in contact with an electrode which is a cathode or an anode formed over an organic layer is provided in the periphery of each pixel. By providing the partition wall which has high adhesiveness to the electrode, when a semiconductor circuit element and the light-emitting element are separated from a substrate, the semiconductor circuit element and the light-emitting element can be separated from the substrate without separation of the organic layer and the electrode from each other.

A manufacturing method of a light-emitting element is as follows. A separation layer is formed over a substrate, a semiconductor circuit element layer is formed over the separation layer, and a plurality of first electrodes electrically connected to the semiconductor circuit element layer are formed over the semiconductor circuit element layer. A partition wall overlapping with an end portion of each of the plurality of first electrodes is formed over the semiconductor circuit element layer; and an organic material layer emitting red light, an organic material layer emitting green light, and an organic material layer emitting blue light are formed over the respective first electrodes. Organic material layers emitting light of the same color are arranged adjacent to each other in a line; and a first region where organic material layers emitting red light are arranged adjacent to each other in a line, a second region where organic material layers emitting green light are arranged adjacent to each other in a line, and a third region where organic material layers emitting blue light are arranged adjacent to each other in a line extend in a first direction. The partition wall exists in a region between the first region and the second region, a region between the second region and the third region, and a region between the third region and the first region, and extends in the first direction. A second electrode is formed using a material having high adhesiveness to the partition wall over the organic material layers to be in contact with the partition wall. In a step of separating a stack structure including the semiconductor circuit element layer, the first electrodes, the partition wall, the organic material layers, and the second electrode from the substrate using the separation layer, the stack structure including the semiconductor circuit element layer, the first electrodes, the partition wall, the organic material layers, and the second electrode is separated from the substrate in a second direction perpendicular to the first direction.

The partition wall is formed using an inorganic material or an organic material. The inorganic material is at least one of silicon oxide, silicon nitride, silicon oxide containing nitrogen, silicon nitride containing oxygen, and diamond-like carbon. The organic material is at least one of polyimide, acrylic, polyamide, polyimide amide, resist, benzocyclobutene, and siloxane.

The second electrode is any one of a light-transmitting anode, a light-transmitting cathode, a light-blocking cathode, and a light-blocking anode.

The light-transmitting anode is formed using any one of indium oxide, an indium oxide-tin oxide alloy, indium oxide-tin oxide containing silicon or silicon oxide, indium oxide containing tungsten oxide and zinc oxide, an indium oxide-zinc oxide alloy, zinc oxide, and zinc oxide to which gallium (Ga) is added.

The light-transmitting cathode is formed using an ultrathin film of a material with a low work function, or a stack of the ultrathin film of a material with a low work function and a light-transmitting conductive film.

The light-blocking cathode is formed using any one of a metal with a low work function, an alloy with a low work function, an electrically conductive compound with a low work function, and a mixture thereof. The metal with a low work function is any one of lithium (Li), cesium (Cs), magnesium (Mg), calcium (Ca), strontium (Sr), europium (Eu), and ytterbium (Yb).

The light-blocking anode is formed using any one of a metal with a high work function, an alloy with a high work function, a conductive compound with a high work function, and a mixture thereof. The metal with a high work function is any one of gold (Au), platinum (Pt), nickel (Ni), tungsten (W), chromium (Cr), molybdenum (Mo), iron (Fe), cobalt (Co), copper (Cu), and palladium (Pd).

An embodiment of the present invention has an effect of suppressing separation at the interface between an electrode and an organic light-emitting layer when a semiconductor circuit element and a light-emitting element are separated from a substrate using a separation layer.

Accordingly, a highly reliable light-emitting device including a light-emitting element and a semiconductor element can be manufactured.

BRIEF DESCRIPTION OF THE DRAWINGS

FIGS. 3A to 3D are cross-sectional views illustrating a manufacturing method of a light-emitting device.

FIG. 14A is a cross-sectional view, FIG. 14B is a top view, FIG. 14C is a front view, and FIG. 14D is a side view, illustrating a mobile phone.

DETAILED DESCRIPTION OF THE INVENTION

Figure 1A:
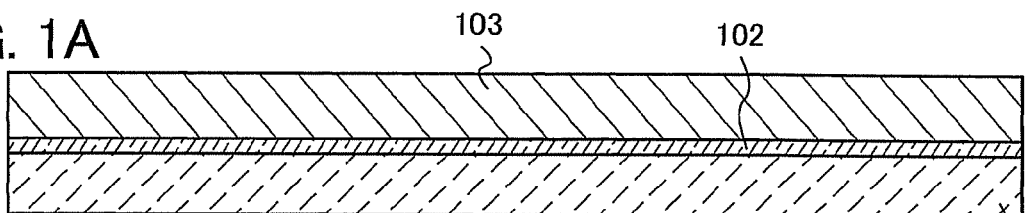
FIGS. 1A to 1E are cross-sectional views illustrating a manufacturing method of a light-emitting device.

Embodiments of the invention disclosed in this specification will be hereinafter described with reference to the accompanying drawings. Note that the invention disclosed in this specification can be carried out in a variety of modes, and it is easily understood by those skilled in the art that modes and details of the invention can be changed in various ways without departing from the spirit and the scope thereof. Therefore, the invention disclosed in this specification is not construed as being limited to the description of the embodiments. Note that, in the drawings, the same portions or portions having similar functions are denoted by the same reference numerals, and repeated description thereof will be omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

Embodiment 1

In this embodiment, a light-emitting device and a method for manufacturing the light-emitting device will be described with reference to FIGS. 1A to 1E, FIG. 2, FIGS. 3A to 3D, FIGS. 4A to 4C, FIGS. 5A and 5B, FIGS. 6A and 6B, FIGS. 7A to 7C, FIG. 8, FIG. 9, FIG. 16, and FIG. 17.

First, FIGS. 1A to 1E illustrate an outline of this embodiment. A separation layer 102 and a semiconductor circuit element 103 are formed over a substrate 101 (FIG. 1A).

As the substrate 101, a glass substrate, a quartz substrate, a semiconductor substrate, a ceramic substrate, a metal substrate, or the like may be used.

As the separation layer 102, a single layer or a stacked layer is formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si) or an alloy material or a compound material mainly containing any of the elements as its main component, by a plasma CVD method, a sputtering method, or the like. A crystalline structure of a layer containing silicon may be any one of an amorphous structure, a microcrystalline structure, and a polycrystalline structure.

When the separation layer 102 has a single layer structure, it is preferable to faun a layer containing any one of tungsten, molybdenum, a mixture of tungsten and molybdenum, an oxide of tungsten, an oxynitride of tungsten, a nitride oxide of tungsten, an oxide of molybdenum, an oxynitride of molybdenum, a nitride oxide of molybdenum, an oxide of a mixture of tungsten and molybdenum, an oxynitride of a mixture of tungsten and molybdenum, and a nitride oxide of a mixture of tungsten and molybdenum. Note that the mixture of tungsten and molybdenum corresponds to an alloy of tungsten and molybdenum, for example.

When the separation layer 102 has a stack structure, preferably, a layer containing tungsten, molybdenum, or a mixture of tungsten and molybdenum is formed as a first layer, and a layer containing an oxide of tungsten, an oxide of molybdenum, an oxide of a mixture of tungsten and molybdenum, an oxynitride of tungsten, an oxynitride of molybdenum, or an oxynitride of a mixture of tungsten and molybdenum is formed as a second layer. In this manner, when the separation layer 102 is fanned to have a stack structure, a stack structure of a metal film and a metal oxide film is preferable. As examples of a method for forming a metal oxide film, there are a method of forming a metal oxide film directly by a sputtering method, a method of forming a metal oxide film by oxidizing a surface of a metal film formed over the substrate 101 by thermal treatment or plasma treatment under an oxygen atmosphere, and the like.

As the metal film, a film formed using, in addition to the above described tungsten (W) and molybdenum (Mo), an element selected from titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing any of the elements as its main component can be used.

Note that an insulating film such as a silicon oxide film, a silicon nitride film, a silicon oxide film containing nitrogen, or a silicon nitride film containing oxygen may be formed over the substrate 101 before the separation layer 102 is formed, and the separation layer 102 may be formed over the insulating film. By such an insulating film provided between the substrate 101 and the separation layer 102, an impurity contained in the substrate 101 can be prevented from entering an upper layer. In addition, when a laser irradiation step is carried out later, the substrate 101 can be prevented from being etched in the step. Note that a silicon oxide film containing nitrogen is distinguished from a silicon nitride film containing oxygen in that the former contains more oxygen than nitrogen, whereas the latter contains more nitrogen than oxygen.

Figure 1B:
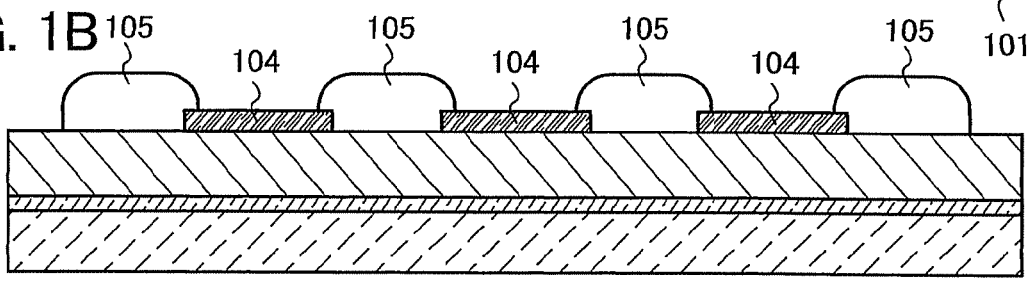

Then, electrodes 104 are formed over the semiconductor circuit element 103 so as to be electrically connected to the semiconductor circuit element 103. A partition wall 105 is formed so as to overlap with end portions of the electrodes 104 (FIG. 1B). The electrode 104 serves as an anode or a cathode of a light-emitting element.

In a light-emitting device, one or both of an anode and a cathode need to be formed using a light-transmitting conductive film. In the case where a light-transmitting conductive film is formed as one of an anode and a cathode below an organic material layer including a light-emitting layer and a light-blocking conductive film is formed as the other of the anode and the cathode over the organic material layer, a bottom-emission light-emitting device is obtained. On the other hand, in the case where a light-blocking conductive film is formed as one of an anode and a cathode below an organic material layer including a light-emitting layer and a light-transmitting conductive film is formed as the other of the anode and the cathode over the organic material layer, a top-emission light-emitting device is obtained. In the case where both an anode and a cathode are each formed using a light-transmitting conductive film, a dual-emission light-emitting device is obtained.

As a material of a light-transmitting anode, a conductive metal oxide film of indium oxide ($In_2O_3$), an indium oxide-tin oxide alloy ($In_2O_3$—$SnO_2$) (indium tin oxide (ITO)), indium oxide-tin oxide containing silicon or silicon oxide, indium oxide containing tungsten oxide and zinc oxide, an indium oxide-zinc oxide alloy ($In_2O_3$—$ZnO$) (indium zinc oxide (IZO)), zinc oxide (ZnO), zinc oxide to which gallium (Ga) is added (ZnO:Ga) in order to increase conductivity or visible light transmissivity, or the like can be used.

A film of any of these materials may be formed by a sputtering method, a vacuum evaporation method, a sol-gel method, or the like.

For example, indium oxide-zinc oxide (IZO) can be formed by a sputtering method using a target in which zinc oxide of 1 wt % to 20 wt % is added to indium oxide. Indium oxide containing tungsten oxide and zinc oxide can be formed by a sputtering method using a target in which tungsten oxide of 0.5 wt % to 5 wt % and zinc oxide of 0.1 wt % to 1 wt % are added to indium oxide.

When a light-transmitting cathode is formed, an ultrathin film of a material with a low work function, such as aluminum, can be used. Alternatively, a stack structure of the ultrathin film of such a material and the above-mentioned light-transmitting conductive film can be employed.

When an electron-injecting layer is provided between the cathode and an electron-transporting layer which will be described later, the cathode can be formed using any of a variety of light-transmitting conductive materials, such as ITO and indium oxide-tin oxide containing silicon or silicon oxide, regardless of its work function. A film of such a conductive material can be formed by a sputtering method, an ink-jet method, a spin coating method, or the like.

When a light-blocking conductive film is used as the cathode, a metal with a low work function (specifically, less than or equal to 3.8 eV), an alloy with a low work function, an electrically conductive compound with a low work function, a mixture thereof, or the like can be used. As a specific example of such a cathode material, an element belonging to Group 1 or 2 in the periodic table, i.e., an alkali metal such as lithium (Li) or cesium (Cs), or an alkaline earth metal such as magnesium (Mg), calcium (Ca), or strontium (Sr), an alloy containing any of these elements (such as MgAg or AlLi), a rare earth metal such as europium (Eu) or ytterbium (Yb), an alloy containing such a rare earth metal, or the like can be used.

When a light-blocking conductive film is used as the anode, a metal with a high work function (specifically, greater than or equal to 4.0 eV), an alloy with a high work function, a conductive compound with a high work function, a mixture thereof, or the like is preferably used.

For example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

The partition wall 105 is formed so as to divide an organic material layer into organic material layers 112 for each pixel and can be formed using an inorganic insulating material or an organic insulating material.

In addition, the partition wall 105 needs to have high adhesiveness to an electrode 106 which will be formed later. In addition, the partition wall 105 can also have a stack structure.

As the inorganic material, for example, silicon oxide, silicon nitride, silicon oxide containing nitrogen, silicon nitride containing oxygen, or diamond-like carbon (DLC) or a stack structure of two or more of these materials can be used. As the organic material, polyimide, acrylic, polyamide, polyimide amide, resist, benzocyclobutene, or siloxane or a stack structure of two or more of these materials may be used.

Siloxane has a skeleton structure formed by the bond of silicon (Si) and oxygen (O), and is formed using, as a starting material, a polymer material including as a substituent at least hydrogen or at least one of fluorine, an alkyl group, and aromatic hydrocarbon. As a substituent, a fluoro group may also be used. Further, as a substituent, an organic group and a fluoro group containing at least hydrogen may be used.

Figure 1C:
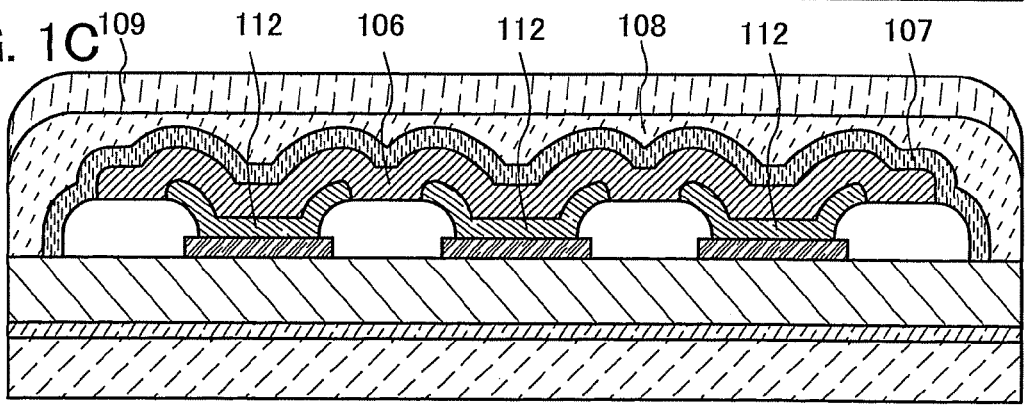

Then, the organic material layers 112 are each formed in a region surrounded by the adjacent partition wall 105 over the electrode 104. The electrode 106 is formed over the organic material layers 112 to be in contact with the partition wall 105, a sealing layer 107 is formed so as to cover the partition wall 105 and the electrode 106, and a protective member 108 is formed over the sealing layer 107. A supporting member 109 is formed over the protective member 108 (FIG. 1C). When the electrode 104 serves as an anode, the electrode 106 serves as a cathode; on the other hand, when the electrode 104 serves as a cathode, the electrode 106 serves as an anode.

In this embodiment, the electrode 106 is formed using an aluminum film, and the partition wall 105 is formed using polyimide. Since polyimide and aluminum have high adhesiveness to each other, they are not separated from each other in a separation step.

The organic material layer 112 includes a light-emitting layer as an essential component. The organic material layer 112 may also include at least one of a hole-injecting layer, a hole-transporting layer, an electron-transporting layer, and an electron-injecting layer. The above layers may be formed by an evaporation method, an ink-jet method, a screen printing method, or the like.

Specific materials used for a hole-injecting layer, a hole-transporting layer, a light-emitting layer, an electron-transporting layer, and an electron-injecting layer are hereinafter described.

The hole-injecting layer is a layer that is provided in contact with an anode, that is, one of the electrode 104 and the electrode 106, and contains a substance with a high hole-injecting property. Molybdenum oxide, vanadium oxide, ruthenium oxide, tungsten oxide, manganese oxide, or the like can be used. In addition, the hole-injecting layer can also be formed using a phthalocyanine compound such as phthalocyanine ($H_2Pc$) or copper phthalocyanine (CuPc); an aromatic amine compound such as 4,4'-bis[N-(4-diphenylaminophenyl)-N-phenylamino]biphenyl (DPAB) or N,N'-bis[4-[bis(3-methylphenyl)amino]phenyl]-N,N'-diphenyl-[1,1'-biphenyl]-4,4'-diamine (DNTPD); a high molecule such as poly(ethylenedioxythiophene)/poly(styrenesulfonic acid) (PEDOT/PSS); or the like.

Alternatively, as the hole-injecting layer, a composite material in which a substance with a high hole-transporting property contains an acceptor substance can be used. Note that, by using such a composite material, a material used to form the electrode may be selected regardless of its work function. In other words, besides a material with a high work function, a material with a low work function may also be used for the anode. As the acceptor substance, 7,7,8,8-tetracyano-2,3,5,6-tetrafluoroquinodimethane ($F_4$-TCNQ), chloranil, and the like can be given. In addition, a transition metal oxide can be given. Further, oxides of metals that belong to Groups 4 to 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily handled.

As the substance with a high hole-transporting property used for the composite material, any of a variety of compounds such as an aromatic amine compound, a carbazole derivative, aromatic hydrocarbon, and a high molecular compound (e.g., an oligomer, a dendrimer, or a polymer) can be used. The organic compound used for the composite material is preferably an organic compound with a high hole-transporting property. Specifically, a substance having a hole mobility of greater than or equal to $10^{-6}$ cm$^2$/Vs is preferably used. However, other substances may also be used as long as they have higher hole-transporting properties than electron-transporting properties. The organic compounds which can be used for the composite material will be specifically given below.

As the aromatic amine compound, for example, there are N,N'-di(p-tolyl)-N,N'-diphenyl-p-phenylenediamine (DTDPPA); 4,4'-bis[N-(4-diphenylaminophenyl)-N-phenylamino]biphenyl (DPAB); N,N'-bis[4-[bis(3-methylphenyl)amino]phenyl]-N,N'-diphenyl-[1,1'-biphenyl]-4,4'-diamine (DNTPD); 1,3,5-tris[N-(4-diphenylaminophenyl)-N-phenylamino]benzene (DPA3B); and the like.

As the carbazole derivative which can be used for the composite material, the following can be specifically given: 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

In addition, examples of the carbazole derivative which can be used for the composite material include 4,4'-di(N-carbazolyl)biphenyl (CBP); 1,3,5-tris[4-(N-carbazolyl)phenyl]benzene (TCPB); 9-[4-(10-phenyl-9-anthryl)phenyl]-9H-carbazole (CzPA); 1,4-bis[4-(N-carbazolyl)phenyl]-2,3,5,6-tetraphenylbenzene; and the like.

Examples of the aromatic hydrocarbon which can be used for the composite material include 2-tert-butyl-9,10-di(2-naphthyl)anthracene (t-BuDNA); 2-tert-butyl-9,10-di(1-naphthyl)anthracene; 9,10-bis(3,5-diphenylphenyl)anthracene (DPPA); 2-tert-butyl-9,10-bis(4-phenylphenyl)anthracene (t-BuDBA); 9,10-di(2-naphthyl)anthracene (DNA); 9,10-diphenylanthracene (DPAnth); 2-tert-butylanthracene (t-BuAnth); 9,10-bis(4-methyl-1-naphthyl)anthracene (DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides these, pentacene, coronene, or the like can also be used. In particular, aromatic hydrocarbon which has a hole mobility of greater than or equal to $1 \times 10^{-6}$ cm$^2$/Vs and 14 to 42 carbon atoms is particularly preferable.

The aromatic hydrocarbon which can be used for the composite material may have a vinyl skeleton. As the aromatic hydrocarbon having a vinyl group, the following are given, for example: 4,4'-bis(2,2-diphenylvinyl)biphenyl (DPVBi); 9,10-bis[4-(2,2-diphenylvinyl)phenyl]anthracene (DPVPA); and the like.

In addition, high molecular compounds such as poly(N-vinylcarbazole) (PVK); poly(4-vinyltriphenylamine) (PVTPA); poly[N-(4-{N'-[4-(4-diphenylamino)phenyl]phenyl-N'-phenylamino}phenyl)methacrylamide] (PTPDMA); and poly[N,N'-bis(4-butylphenyl)-N,N'-bis(phenyl)benzidine] (Poly-TPD) can also be used.

The hole-transporting layer is a layer that contains a substance with a high hole-transporting property. Examples of the substance with a high hole-transporting property include aromatic amine compounds such as 4,4'-bis[N-(1-naphthyl)-N-phenylamino]biphenyl (NPB); N,N'-bis(3-methylphenyl)-N,N'-diphenyl-[1,1'-biphenyl]-4,4'-diamine (TPD); 4,4',4"-tris(N,N-diphenylamino)triphenylamine (TDATA); 4,4',4"-tris[N-(3-methylphenyl)-N-phenylamino]triphenylamine (MTDATA); 4,4'-bis[N-(Spiro-9,9'-bifluoren-2-yl)-N-phenylamino]biphenyl (BSPB); and the like. The substances mentioned here are mainly substances that have a hole mobility of greater than or equal to $10^{-6}$ cm$^2$/V·s. However, other substances may also be used as long as they have higher hole-transporting properties than electron-transporting properties. The layer containing a substance with a high hole-transporting property is not limited to a single layer, and two or more layers containing the aforementioned substances may be stacked.

Further, a high molecular compound such as poly(N-vinylcarbazole) (PVK) or poly(4-vinyltriphenylamine) (PVTPA) can also be used for the hole-transporting layer.

The light-emitting layer is a layer containing a light-emitting substance. The light-emitting layer may be either a so-called light-emitting layer of a single film including an emission center material as its main component or a so-called light-emitting layer of a host-guest type in which an emission center material is dispersed in a host material.

There is no limitation on an emission center material which is used, and a known material that emits fluorescence or phosphorescence can be used. A fluorescent material is, for example, N,N'-bis[4-(9H-carbazol-9-yl)phenyl]-N,N'-diphenylstilbene-4,4'-diamine (YGA2S); 4-(9H-carbazol-9-yl)-4'-

(10-phenyl-9-anthryl)triphenylamine (YGAPA); or another material having an emission wavelength of greater than or equal to 450 nm, such as 4-(9H-carbazol-9-yl)-4'-(9,10-diphenyl-2-anthryl)triphenylamine (2YGAPPA); N,9-diphenyl-N-[4-(10-phenyl-9-anthryl)phenyl]-9H-carbazol-3-amine (PCAPA); perylene; 2,5,8,11-tetra-tert-butylperylene (TBP); 4-(10-phenyl-9-anthryl)-4'-(9-phenyl-9H-carbazol-3-yl)triphenylamine (PCBAPA); N,N''-(2-tert-butylanthracene-9,10-diyldi-4,1-phenylene)bis[N,N',N'-triphenyl-1,4-phenylenediamine] (DPABPA); N,9-diphenyl-N-[4-(9,10-diphenyl-2-anthryl)phenyl]-9H-carbazol-3-amine (2PCAPPA); N-[4-(9,10-diphenyl-2-anthryl)phenyl]-N,N',N'-triphenyl-1,4-phenylenediamine (2DPAPPA); N,N,N',N',N'',N'',N''',N'''-octaphenyldibenzo[g,p]chrysene-2,7,10,15-tetramine (DBC1); coumarin 30; N-(9,10-diphenyl-2-anthryl)-N,9-diphenyl-9H-carbazol-3-amine (2PCAPA); N-[9,10-bis(1,1'-biphenyl-2-yl)-2-anthryl]-N,9-diphenyl-9H-carbazol-3-amine (2PCABPhA); N-(9,10-diphenyl-2-anthryl)-N,N',N'-triphenyl-1,4-phenylenediamine (2DPAPA); N-[9,10-bis(1,1'-biphenyl-2-yl)-2-anthryl]-N,N',N'-triphenyl-1,4-phenylenediamine (2DPABPhA); 9,10-bis(1,1'-biphenyl-2-yl)-N-[4-(9H-carbazol-9-yl)phenyl]-N-phenylanthracen-2-amine (2YGABPhA); N,N,9-triphenylanthracen-9-amine (DPhAPhA); coumarin 545T; N,N'-diphenylquinacridone (DPQd); rubrene; 5,12-bis(1,1'-biphenyl-4-yl)-6,11-diphenyltetracene (BPT); 2-(2-{2-[4-(dimethylamino)phenyl]ethenyl}-6-methyl-4H-pyran-4-ylidene)propanedinitrile (DCM1); 2-{2-methyl-6-[2-(2,3,6,7-tetrahydro-1H,5H-benzo[ij]quinolizin-9-yl)ethenyl]-4H-pyran-4-ylidene}propanedinitrile (DCM2); N,N,N',N'-tetrakis(4-methylphenyl)tetracene-5,11-diamine (p-mPhTD); 7,14-diphenyl-N,N,N',N'-tetrakis(4-methylphenyl)acenaphtho[1,2-a]fluoranthene-3,10-diamine (p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (DCJTB); 2-(2,6-bis{2-[4-(dimethylamino)phenyl]ethenyl}-4H-pyran-4-ylidene) propanedinitrile (BisDCM); or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (BisDCJTM). As phosphorescent materials, for example, in addition to bis[2-(4',6'-difluorophenyl)pyridinato-N,C$^{2'}$]iridium(III)tetrakis(1-pyrazolyl) borate (FIr6) and the like, there are phosphorescent materials with an emission wavelength in the range of 470 nm to 500 nm, such as bis[2-(4',6'-difluorophenyl)pyridinato-N,C$^{2'}$]iridium(III)picolinate (FIrpic); bis[2-(3',5'-bistrifluoromethylphenyl)pyridinato-N,C$^{2'}$]iridium(III)picolinate (Ir(CF$_3$ppy)$_2$(pic)); and bis[2-(4',6'-difluorophenyl)pyridinato-N,C$^{2'}$]iridium(III)acetylacetonate (FIracac), phosphorescent materials with an emission wavelength of greater than or equal to 500 nm (materials which emit green light), such as tris(2-phenylpyridinato)iridium(III) (Ir(ppy)$_3$); bis(2-phenylpyridinato)iridium(III)acetylacetonate (Ir(ppy)$_2$(acac)); tris(acetylacetonato)(monophenanthroline)terbium(III) (Tb(acac)$_3$(Phen)); bis(benzo[h]quinolinato)iridium(III)acetylacetonate (Ir(bzq)$_2$(acac)); bis(2,4-diphenyl-1,3-oxazolato-N,C$^{2'}$)iridium(III)acetylacetonate (Ir(dpo)$_2$(acac)); bis[2-(4'-perfluorophenylphenyl)pyridinato]iridium(III) acetylacetonate (Ir(p-PF-ph)$_2$(acac)); bis(2-phenylbenzothiazolato-N,C$^{2'}$)iridium(III)acetylacetonate (Ir(bt)$_2$(acac)); bis[2-(2'-benzo[4,5-a]thienyl)pyridinato-N,C$^{3'}$] iridium(III)acetylacetonate (Ir(btp)$_2$(acac)); bis(1-phenylisoquinolinato-N,C$^{2'}$)iridium(III)acetylacetonate (Ir (piq)$_2$(acac)); (acetylacetonato)bis[2,3-bis(4-fluorophenyl) quinoxalinato]iridium(III) (Ir(Fdpq)$_2$(acac)); (acetylacetonato)bis(2,3,5-triphenylpyrazinato)iridium(III) (Ir(tppr)$_2$(acac)); 2,3,7,8,12,13,17,18-octaethyl-21H,23H-porphyrinplatinum(II) (PtOEP); tris(1,3-diphenyl-1,3-propanedionato)(monophenanthroline)europium(III) (Eu(DBM)$_3$(Phen)); and tris[1-(2-thenoyl)-3,3,3-trifluoroacetonato](monophenanthroline)europium(III) (Eu(TTA)$_3$(Phen)), and the like. The emission center material can be selected from the above-mentioned materials or other known materials in consideration of emission color of each light-emitting element.

When the host material is used, for example, the following can be given: metal complexes such as tris(8-quinolinolato) aluminum(III) (Alq); tris(4-methyl-8-quinolinolato)aluminum(III) (Almq$_3$); bis(10-hydroxybenzo[h]quinolinato)beryllium(II) (BeBq$_2$); bis(2-methyl-8-quinolinolato)(4-phenylphenolato)aluminum(III) (BAlq); bis(8-quinolinolato)zinc(II) (Znq); bis[2-(2-benzoxazolyl) phenolato]zinc(II) (ZnPBO); and bis[2-(2-benzothiazolyl) phenolato]zinc(II) (ZnBTZ); heterocyclic compounds such as 2-(4-biphenylyl)-5-(4-tert-butylphenyl)-1,3,4-oxadiazole (PBD); 1,3-bis[5-(p-tert-butylphenyl)-1,3,4-oxadiazol-2-yl] benzene (OXD-7); 3-(4-biphenylyl)-4-phenyl-5-(4-tert-butylphenyl)-1,2,4-triazole (TAZ); 2,2',2''-(1,3,5-benzenetriyl) tris(1-phenyl-1H-benzimidazole) (TPBI); bathophenanthroline (BPhen); bathocuproine (BCP); and 9-[4-(5-phenyl-1,3,4-oxadiazol-2-yl)phenyl]-9H-carbazole (CO11); and aromatic amine compounds such as NPB (or a-NPD); TPD; and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (DPAnth); N,N-diphenyl-9-[4-(10-phenyl-9-anthryl)phenyl]-9H-carbazol-3-amine (CzA1PA); 4-(10-phenyl-9-anthryl)triphenylamine (DPhPA); 4-(9H-carbazol-9-yl)-4'-(10-phenyl-9-anthryl) triphenylamine (YGAPA); N,9-diphenyl-N-[4-(10-phenyl-9-anthryl)phenyl]-9H-carbazol-3-amine (PCAPA); N,9-diphenyl-N-{4-[4-(10-phenyl-9-anthryl)phenyl]phenyl}-9H-carbazol-3-amine (PCAPBA); N,9-diphenyl-N-(9,10-diphenyl-2-anthryl)-9H-carbazol-3-amine (2PCAPA); 6,12-dimethoxy-5,11-diphenylchrysene; N,N,N',N',N'',N'',N''',N'''-octaphenyldibenzo[g,p]chrysene-2,7,10,15-tetramine (DBC1); 9-[4-(10-phenyl-9-anthryl)phenyl]-9H-carbazole (CzPA); 3,6-diphenyl-9-[4-(10-phenyl-9-anthryl)phenyl]-9H-carbazole (DPCzPA); 9,10-bis(3,5-diphenylphenyl)anthracene (DPPA); 9,10-di(2-naphthyl)anthracene (DNA); 2-tert-butyl-9,10-di(2-naphthyl)anthracene (t-BuDNA); 9,9'-bianthryl (BANT); 9,9'-(stilbene-3,3'-diyl)diphenanthrene (DPNS); 9,9'-(stilbene-4,4'-diyl)diphenanthrene (DPNS2); 3,3',3''-(benzene-1,3,5-triyl)tripyrene (TPB3); and the like. From these materials or other known materials, a material may be selected which has a larger energy gap (or a triplet energy if the material emits phosphorescence) than an emission center material dispersed in the material and which has a transporting property as needed.

The electron-transporting layer is a layer that contains a substance with a high electron-transporting property. For example, a layer formed using a metal complex having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]-quinolinato)beryllium (BeBq$_2$), or bis(2-methyl-8-quinolinolato)(4-phenylphenolato)aluminum (BAlq), or the like can be used. Alternatively, a metal complex having an oxazole-based or thiazole-based ligand, such as bis[2-(2-hydroxyphenyl)benzoxazolato]zinc ($Zn(BOX)_2$) or bis[2-(2-hydroxyphenyl)benzothiazolato]zinc ($Zn(BTZ)_2$), or the like can be used. Besides the metal complexes, 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7); 3-(4-biphenylyl)-4-phenyl-5-(4-tert-butylphenyl)-1,2,4-triazole (TAZ); bathophenanthroline (BPhen); bathocuproine (BCP); or the like can also be used. The substances mentioned here are mainly substances that have an electron mobility of greater than or equal to $10^{-6}$ $cm^2/V \cdot s$. The electron-transporting layer may be formed of other materials as long as they have higher electron-transporting properties than hole-transporting properties.

Furthermore, the electron-transporting layer is not limited to a single layer, and two or more layers made of the aforementioned substances may be stacked.

Further, a layer for controlling transfer of electron carriers may be provided between the electron-transporting layer and the light-emitting layer. Specifically, the layer for controlling transfer of electron carriers is a layer formed by adding a small amount of substance with a high electron-trapping property to the material with a high electron-transporting property as described above and suppresses transfer of electron carriers, so that carrier balance can be adjusted. Such a structure is very effective in suppressing a problem (such as shortening of element lifetime) caused when electrons pass through the light-emitting layer.

The electron-injecting layer which is provided in contact with the cathode that is the other of the electrode 104 and the electrode 106 can be formed using an alkali metal, an alkaline earth metal, or a compound thereof, such as lithium fluoride (LiF), cesium fluoride (CsF), or calcium fluoride ($CaF_2$). For example, a layer formed from a material with an electron-transporting property, which contains an alkali metal, an alkaline earth metal, or a compound thereof, (for example, a layer of Alq that contains magnesium (Mg)), can be used. Note that the electron-injecting layer is preferably a layer formed from a material with an electron-transporting property, which contains an alkali metal or an alkaline earth metal, because electrons can be efficiently injected from the cathode.

When emission of red (R) light, green (G) light, and blue (B) light is obtained using the organic material layers 112, the thicknesses of the organic material layers 112 may be varied in accordance with the wavelengths of light of R, G, and B. For example, in the case where one of the electrode 104 and the electrode 106 is formed using a reflective conductive film, there are first light which is emitted from the light-emitting layer to the outside through the other of the electrode 104 and the electrode 106, and second light which is emitted from the light-emitting layer, reflected at one of the electrode 104 and the electrode 106, and then emitted to the outside through the other of the electrode 104 and the electrode 106. Since the wavelengths of light are different between red (R) light, green (G) light, and blue (B) light, an optimal distance between the first light and the second light with which the first light and the second light interfere with each other to increase their intensities can be obtained by varying the thicknesses of the organic material layers 112 in accordance with R, and B.

The sealing layer 107 serves as a passivation film and may be formed using, for example, an inorganic film with a moisture-proof property such as a silicon nitride film, an aluminum oxide film, or a silicon oxide film containing nitrogen with a single layer or a stacked layer by sputtering or the like. Alternatively, the sealing layer 107 may be formed using a stack structure of an organic film and an inorganic film with a moisture-proof property. Such an organic film needs flatness and a stress relaxation property and may be formed by evaporation polymerization of polylactic acid, for example.

The protective member 108 may be formed using an epoxy resin, an acrylic resin, or a structure body (prepreg) described later which is obtained in such a manner that a sheet-like fibrous body is impregnated with an organic resin.

The supporting member 109 may be formed using a resin material or a film which can be separated again, for example, a UV separation film which is separated by being irradiated with UV light or the like.

Figure 1D:
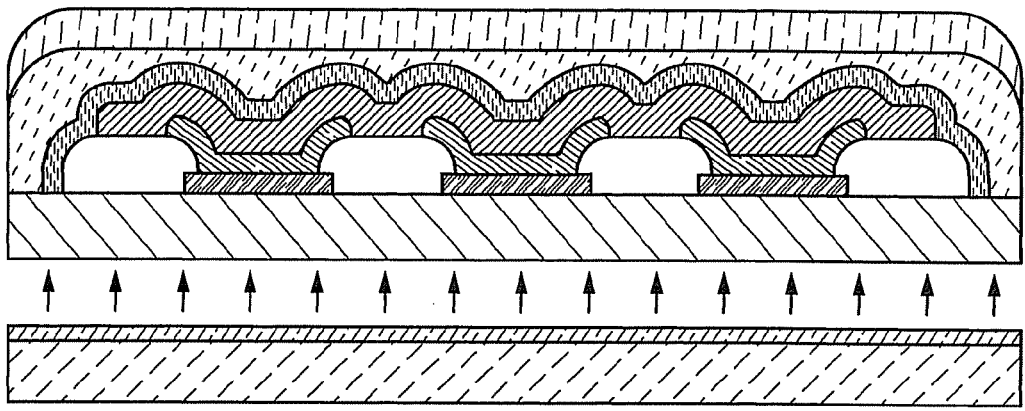

Then, a stack structure including the semiconductor circuit element 103, the electrodes 104, the partition wall 105, the organic material layers 112, the electrode 106, and the sealing layer 107, the protective member 108, and the supporting member 109 are separated from the substrate 101 using the separation layer 102 (FIG. 1D).

Figure 1E:
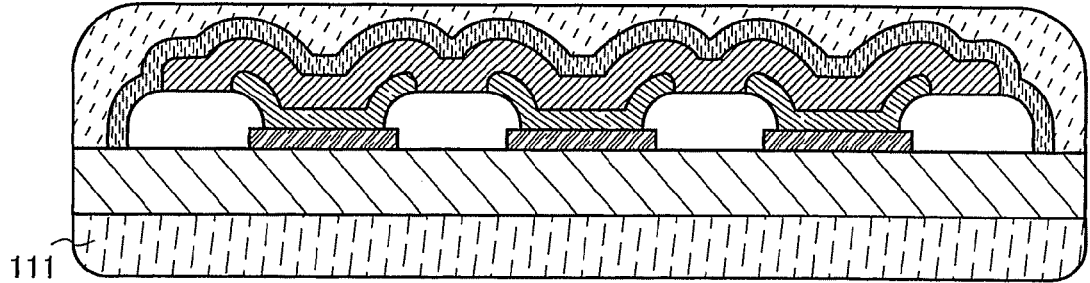

The stack structure including the semiconductor circuit element 103, the electrodes 104, the partition wall 105, the organic material layers 112, the electrode 106, and the sealing layer 107, and the protective member 108, which are separated, are attached to a base 111 (FIG. 1E). The base 111 may be attached to the semiconductor circuit element 103 using an adhesive. The supporting member 109 may be separated from the protective member 108 after being attached to the base 111.

As the base 111, a flexible substrate or the like may be used. For example, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like is preferably used. A material with a low thermal expansion coefficient is preferably used for the base 111 because it can suppress stretch of the substrate at high temperature, deformation of the substrate, and generation of a crack.

Figure 7A:
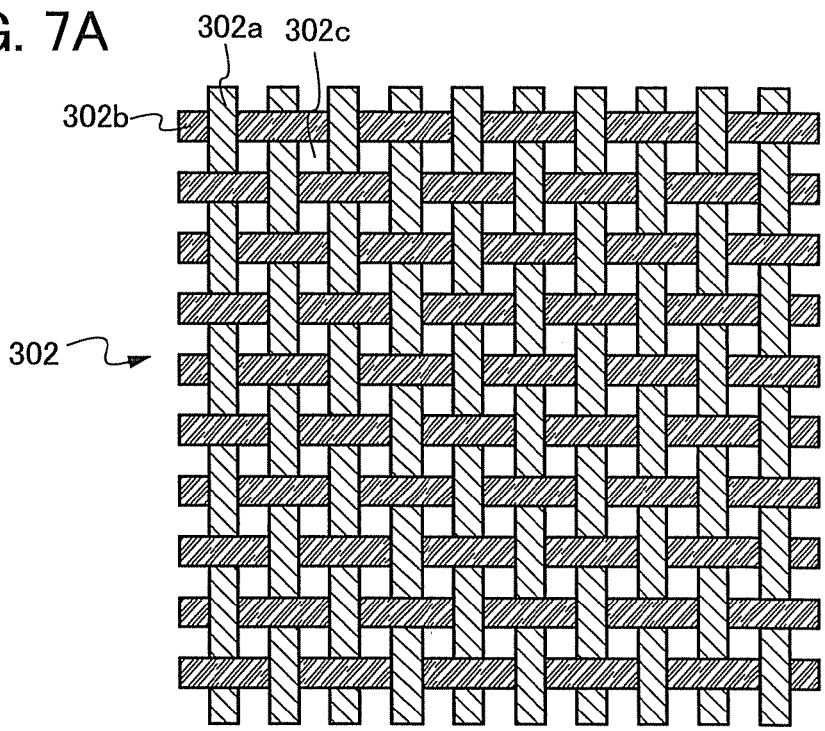
FIGS. 7A and 7B are top views each illustrating a sheet-like fibrous body.
Figure 7B:
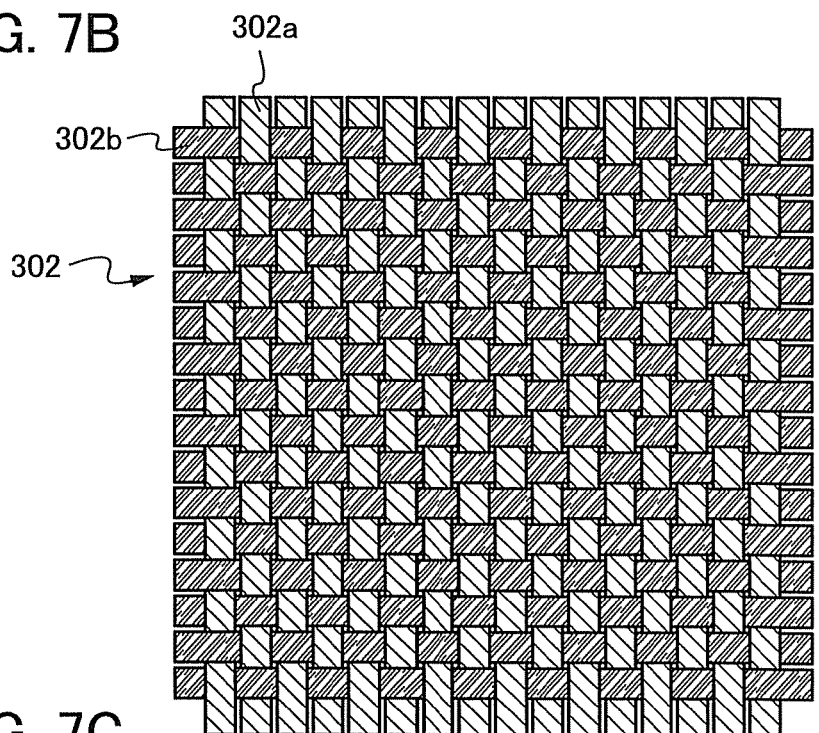
Figure 7C:
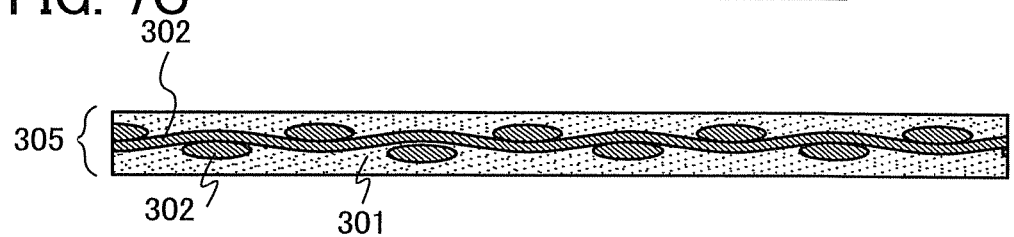
FIG. 7C is a cross-sectional view of a structure body.

In addition, as the base 111, a structure body 305 in which a sheet-like fibrous body 302 is impregnated with an organic resin 301 may be used (FIG. 7C). Such a structure body 305 is also called a prepreg. A prepreg is specifically formed in such a manner that, after a sheet-like fibrous body is impregnated with a composition in which a matrix resin is diluted with an organic solvent, drying is performed so that the organic solvent is volatilized and the matrix resin is semi-cured.

FIGS. 7A and 7B are each a top view of the sheet-like fibrous body 302 which is a fabric woven using yarn bundles for warp yarns and weft yarns. In addition, a cross-sectional view of the structure body 305 in which the sheet-like fibrous body 302 is impregnated with the organic resin 301 is illustrated in FIG. 7C.

The sheet-like fibrous body 302 is a woven fabric or a nonwoven fabric of an organic compound or an inorganic compound. Alternatively, as the sheet-like fibrous body 302, a high-strength fiber of an organic compound or an inorganic compound may be used.

In addition, the sheet-like fibrous body 302 may be a woven fabric which is woven using bundles of fibers (single yarns) (hereinafter, referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be appropriately used.

The yarn bundle may have a circular shape or an elliptical shape in its cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which has been subjected to fiber opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in its cross section. By using yarn bundles having an elliptical cross-sectional shape or a flat cross-sectional shape as described above, it is possible to reduce the thickness of the sheet-like fibrous body 302. Accordingly, the structure body 305 can be made thin, and thus, a thin semiconductor device can be manufactured.

As illustrated in FIG. 7A, the sheet-like fibrous body 302 is woven using warp yarns 302a spaced at regular intervals and weft yarns 302b spaced at regular intervals. Such a fibrous body has regions without the warp yarns 302a or the weft yarns 302b (referred to as basket holes 302c). Such a sheet-like fibrous body 302 can be further impregnated with the organic resin 301, whereby adhesiveness of the sheet-like fibrous body 302 can be increased. Note that although neither the warp yarns 302a nor the weft yarns 302b exist in the basket holes 302c of the structure body 305, the basket holes 302c are filled with the organic resin 301.

As illustrated in FIG. 7B, in the sheet-like fibrous body 302, the density of the warp yarns 302a and the weft yarns 302b may be high and the proportion of the basket holes 302c may be low. Typically, the size of the basket hole 302c is preferably smaller than the area of a locally pressed portion. More typically, the basket hole 302c preferably has a rectangular shape having a side with a length of 0.01 mm to 0.2 mm inclusive. When the basket hole 302c of the sheet-like fibrous body 302 has such a small area, even when pressure is applied by a member with a sharp tip (typically, a writing instrument such as a pen or a pencil), the pressure can be absorbed by the entire sheet-like fibrous body 302.

Furthermore, the yarn bundles may be subjected to surface treatment so that the organic resin 301 can permeate the yarn bundles more effectively. For example, as the surface treatment, corona discharge treatment, plasma discharge treatment, or the like for activating the surface of the yarn bundle can be given. Further, surface treatment using a silane coupling agent or a titanate coupling agent can be given.

A high-strength fiber is specifically a fiber with a high modulus of elasticity or a fiber with a high Young's modulus. As typical examples of the high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As the glass fiber, a glass fiber using E glass, S glass, D glass, Q glass, or the like can be used. Note that the sheet-like fibrous body 302 may also be formed from one or more kinds of the above-mentioned high-strength fibers.

As the organic resin 301 with which the sheet-like fibrous body 302 is impregnated, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. Furthermore, a plurality of the above-described thermosetting resins and thermoplastic resins may be used. By using the above-described organic resin, the sheet-like fibrous body can be fixed to the semiconductor element layer by heat treatment. The higher the glass transition temperature of the organic resin 301 is, the less easily the organic resin 301 is damaged by local pressure; thus, the organic resin 301 preferably has a high glass transition temperature.

High-thermal conductive filler may be dispersed in the organic resin 301 or in yarn bundles of fibers. As the high-thermal conductive filler, aluminum nitride, boron nitride, silicon nitride, alumina, or the like can be given. As the high-thermal conductive filler, a metal particle of silver, copper, or the like can also be given. When the high-thermal conductive filler is included in the organic resin or the yarn bundle, heat generated in the element layer can be easily released to the outside. Accordingly, thermal storage of the semiconductor device can be suppressed, and breakdown of the semiconductor device can be suppressed.

Figure 8:
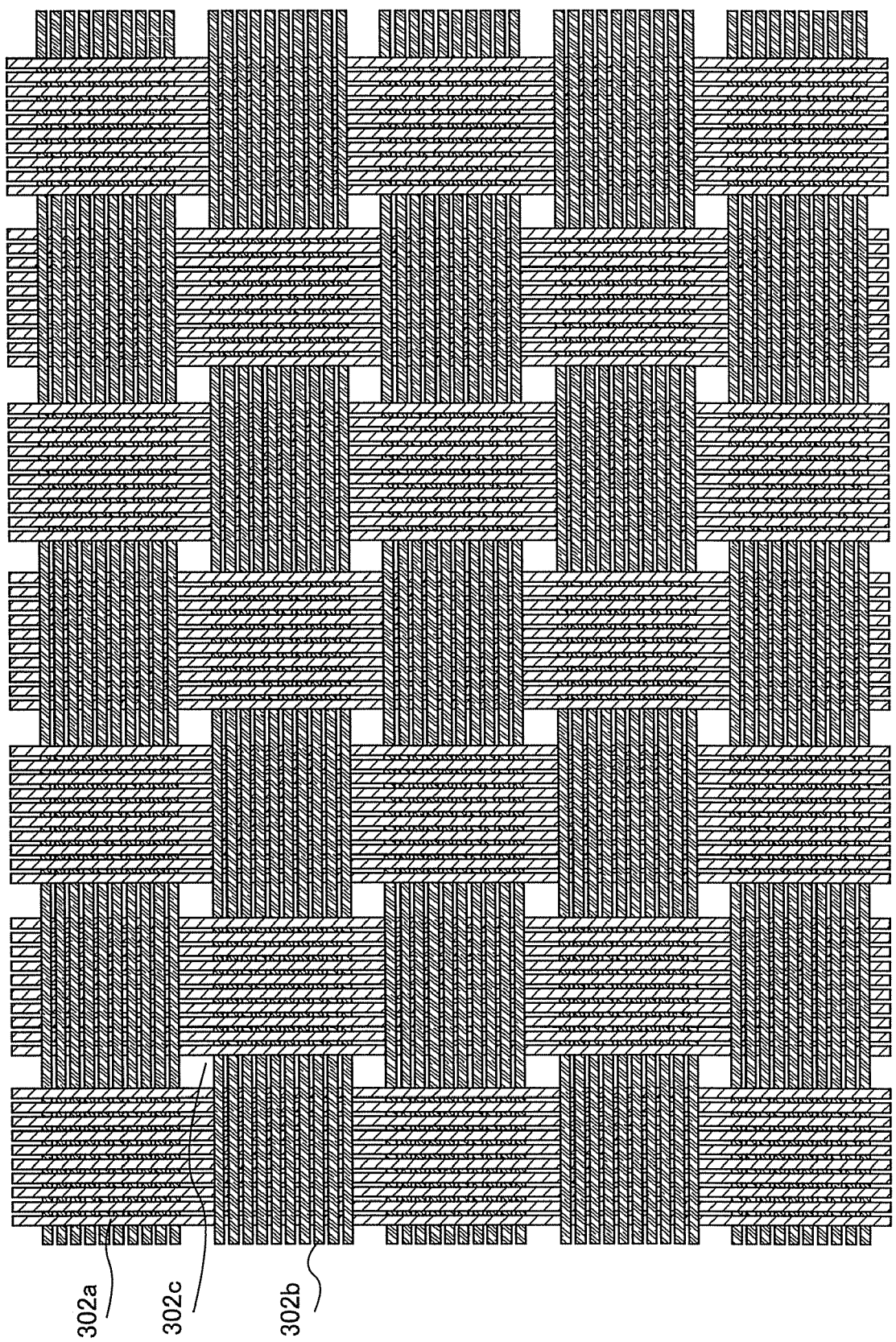
FIG. 8 is a top view illustrating a sheet-like fibrous body.
Figure 9:
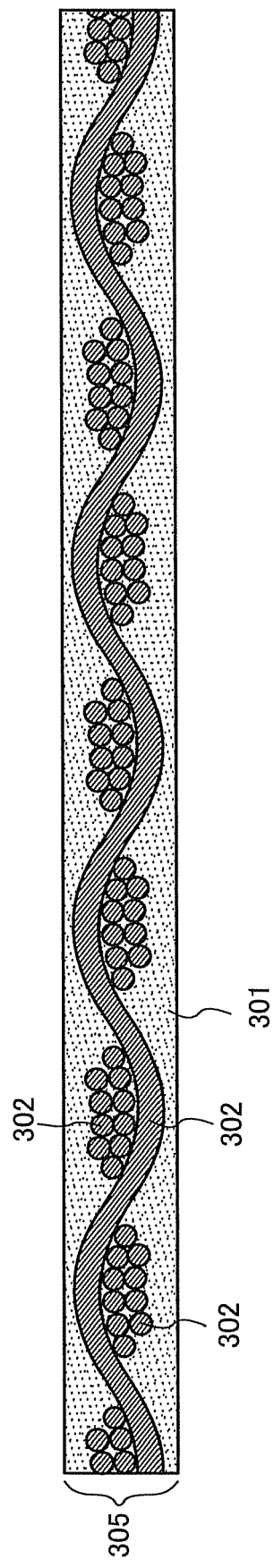
FIG. 9 is a cross-sectional view illustrating a structure body.

FIGS. 7A and 7B each show a sheet-like fibrous body formed by weaving warp yarns and weft yarns one by one. However, the number of warp yarns and the number of weft yarns are not limited thereto. The number of warp yarns and the number of weft yarns may be determined as needed. For example, FIG. 8 and FIG. 9 are respectively a top view and a cross-sectional view of a sheet-like fibrous body that is woven using a bundle of ten warp yarns and a bundle of ten weft yarns. In FIG. 9, the sheet-like fibrous body 302 is impregnated with the organic resin 301 to form the structure body 305.

As described above, since the area where the electrode 106 and the partition wall 105 are in contact with each other is large, the electrode 106 and the organic material layers 112 can be prevented from being separated from each other in the separation.

Then, a light-emitting device in which a thin film transistor (TFT) is formed as the semiconductor circuit element 103 and a method for manufacturing the light-emitting device will be described with reference to FIG. 2, FIGS. 3A to 3D, FIGS. 4A to 4C, FIGS. 5A and 5B, FIGS. 6A and 6B, FIGS. 7A to 7C, FIG. 8, and FIG. 9.

First, a separation layer 222 and a base film 204 are formed over a substrate 221 (FIG. 3A). As the substrate 221, a material similar to that of the substrate 101 may be used.

The base film 204 may be a silicon oxide film, a silicon nitride film, a silicon oxide film containing nitrogen, or a silicon nitride film containing oxygen, or a stacked layer of any two or more of these films.

The separation layer 222 may be formed using a material similar to that of the separation layer 102.

Note that an insulating film such as a silicon oxide film, a silicon nitride film, a silicon oxide film containing nitrogen, or a silicon nitride film containing oxygen may be formed over the substrate 221 before the separation layer 222 is formed, and the separation layer 222 may be formed over the insulating film. By such an insulating film provided between the substrate 221 and the separation layer 222, an impurity contained in the substrate 221 can be prevented from entering an upper layer. In addition, when a laser irradiation step is carried out later, the substrate 221 can be prevented from being etched in the step. Note that a silicon oxide film containing nitrogen is distinguished from a silicon nitride film containing oxygen in that the former contains more oxygen than nitrogen, whereas the latter contains more nitrogen than oxygen.

Next, island-like semiconductor films 225 are formed over the base film 204; a gate insulating film 205 is formed to cover the base film 204 and the island-like semiconductor films 225; and gate electrodes 236 are formed over the island-like semiconductor films 225 with the gate insulating film 205 interposed therebetween (FIG. 3B).

The island-like semiconductor films 225 can be formed using any of the following materials: an amorphous semiconductor manufactured by a sputtering method or a vapor-phase growth method using a gas containing a semiconductor material typified by silicon (Si) or germanium (Ge); a polycrystalline semiconductor formed by crystallizing the amorphous semiconductor with the use of optical energy or thermal energy; a microcrystalline (also referred to as semi-amorphous or microcrystal) semiconductor; a semiconductor containing an organic material as its main component; and the like. The island-like semiconductor films 225 may each be formed by forming a semiconductor film by a sputtering method, an LPCVD method, a plasma CVD method, or the like and then etching the semiconductor film into an island-like shape. In this embodiment, island-like silicon films are formed as the island-like semiconductor films 225.

As a material of the island-like semiconductor films 225, as well as an element such as silicon (Si) or geranium (Ge), a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of two or more of the above oxide semiconductors, or the like can be used. For example, an oxide semiconductor formed of zinc oxide, indium oxide, and gallium oxide, or the like can also be used. In the case of using zinc oxide for the island-like semiconductor films 225, the gate insulating film 205 may be formed using $Y_2O_3$, $Al_2O_3$, or $TiO_2$, a stacked layer thereof, or the like, and the gate electrodes 236 and electrodes 215a and electrodes 215b which are described below may be formed using ITO, Au, Ti, or the like. In addition, In, Ga, or the like can be added to ZnO.

The gate electrodes 236 may be formed by a CVD method, a sputtering method, a droplet discharge method, or the like using an element selected from Ag, Au, Cu, Ni, Pt, Pd, Ir, Rh, W, Al, Ta, Mo, Cd, Zn, Fe, Ti, Si, Ge, Zr, and Ba or an alloy material or a compound material containing any of the elements as its main component. Alternatively, a semiconductor film typified by a polycrystalline silicon film doped with an impurity element such as phosphorus, or an AgPdCu alloy may be used. Further, either a single layer structure or a stack structure of a plurality of layers may be employed.

In addition, a channel formation region 233, a region 234a which is one of a source region and a drain region, and a region 234b which is the other of the source region and the drain region are formed in each of the island-like semiconductor films 225 (FIG. 3C). The region 234a and the region 234b may be formed by adding an impurity element imparting one conductivity type to the island-like semiconductor film 225 with the gate electrode 236 used as a mask. As the impurity element imparting one conductivity type, phosphorus (P) or arsenic (As) which is an impurity element imparting n-type conductivity or boron (B) which is an impurity element imparting p-type conductivity may be used.

A low-concentration impurity region may be formed in each of a region between the channel formation region 233 and the region 234a and a region between the channel formation region 233 and the region 234b.

Next, an insulating film 206 and an insulating film 207 are formed to cover the gate insulating film 205 and the gate electrodes 236. Furthermore, the electrodes 215a which are each electrically connected to the region 234a and the electrodes 215b which are each electrically connected to the region 234b are formed over the insulating film 207. In the aforementioned manner, TFTs 211 which are included in the semiconductor circuit are manufactured (FIG. 3D).

The insulating film 206 and the insulating film 207 may each be formed using any of the materials mentioned in the description of the base film 204. In this embodiment, a silicon nitride film containing oxygen is formed as the insulating film 206, and a silicon oxide film containing nitrogen is formed as the insulating film 207. This is in order to terminate a dangling bond in the island-like semiconductor films 225 with hydrogen contained in the silicon nitride film containing oxygen through heat treatment. Alternatively, as needed, either the insulating film 206 or the insulating film 207 may be formed.

The electrodes 215a and the electrodes 215b may each be formed using any of the materials mentioned in the description of the gate electrodes 236.

Figure 4A:
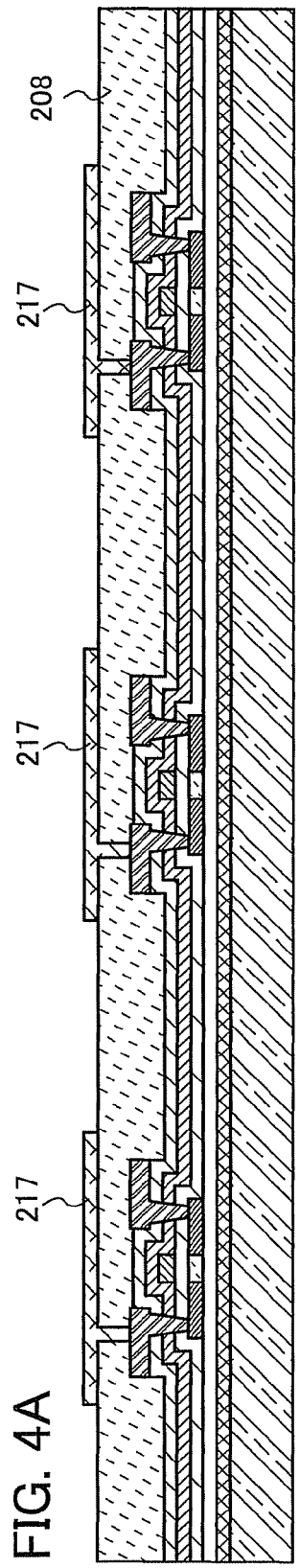
FIGS. 4A to 4C are cross-sectional views illustrating a manufacturing method of a light-emitting device.

Next, an insulating film 208 is formed to cover the insulating film 207, the electrodes 215a, and the electrodes 215b, and electrodes 217 which are each electrically connected to one of the electrode 215a and the electrode 215b are formed over the insulating film 208 (FIG. 4A).

The insulating film 208 may be formed using an organic insulating material or an inorganic insulating material.

As the inorganic material, for example, silicon oxide, silicon nitride, silicon oxide containing nitrogen, or diamond-like carbon (DLC) or a stack structure of two or more of these materials can be used. As the organic material, polyimide, acrylic, polyamide, polyimide amide, resist, benzocyclobutene, or siloxane or a stack structure of two or more of these materials may be used.

The electrodes 217 may be formed using any of the materials mentioned in the description of the gate electrodes 236.

Figure 4B:
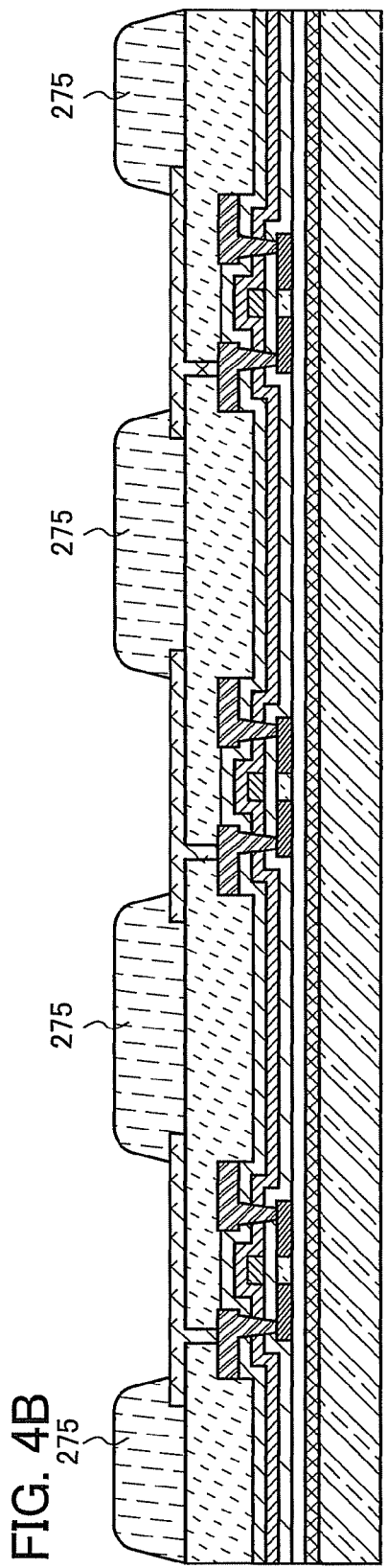

Then, a partition wall 275 is formed over the insulating film 208 (FIG. 4B). The partition wall 275 may be formed using any of the materials mentioned in the description of the insulating film 208. The partition wall 275 overlaps with part of the adjacent electrodes 217, whereby the electrodes 217 and organic material layers 112 which are formed later are provided for their respective pixels.

Figure 4C:
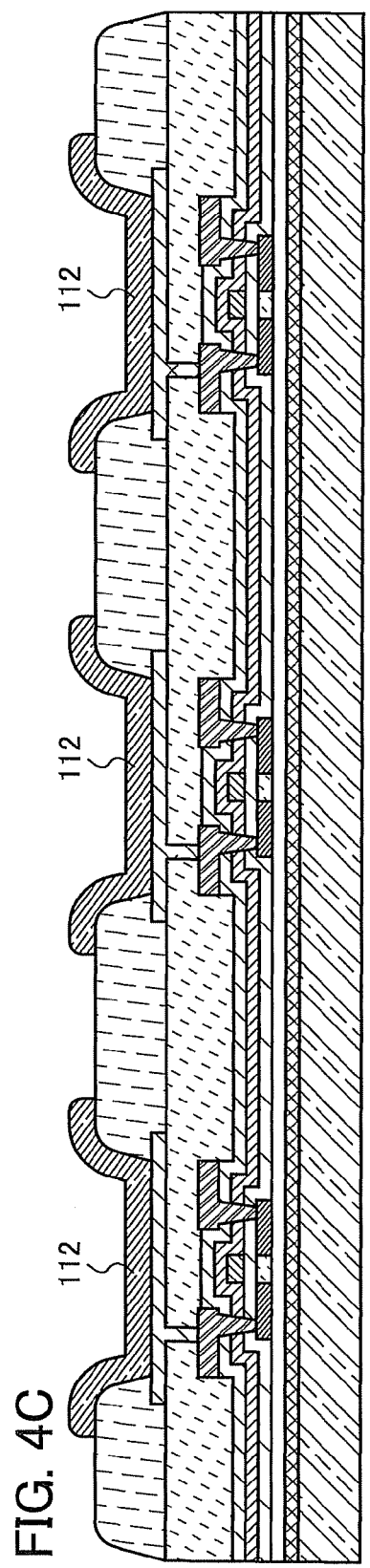

The organic material layer 112 is formed in a region surrounded by the adjacent partition wall 275 over the electrode 217 (FIG. 4C).

An electrode 113 is formed over the organic material layers 112 and the partition wall 275. The electrode 113 may be formed using any of the materials mentioned in the description of the electrode 106.

Figure 5A:
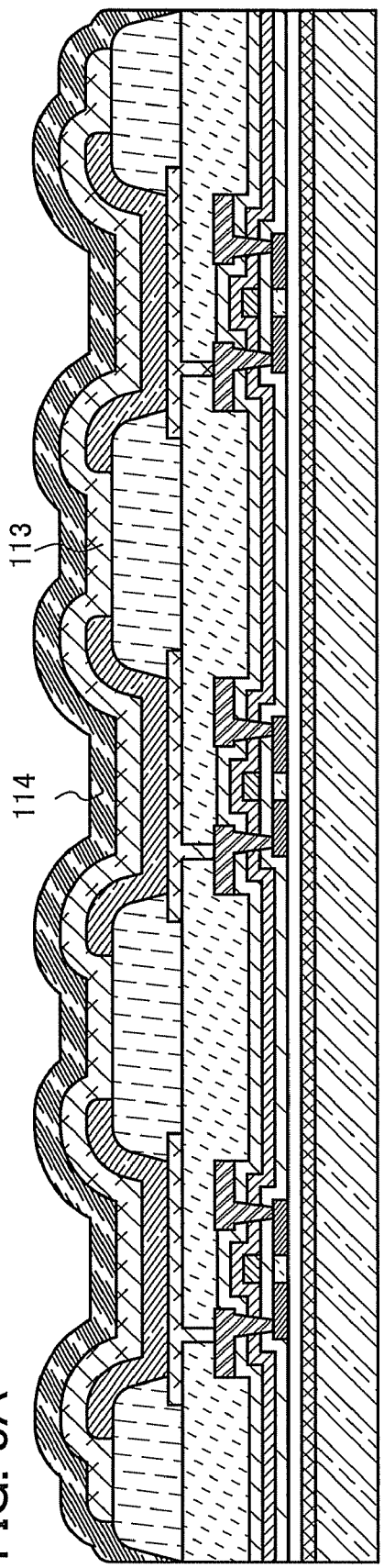
FIGS. 5A and 5B are cross-sectional views illustrating a manufacturing method of a light-emitting device.

A sealing layer 114 is formed over the electrode 113 (FIG. 5A). The sealing layer 114 may be formed using a material similar to that of the sealing layer 107.

A protective member 241 is formed over the sealing layer 114. The protective member 241 may be formed using a material similar to that of the protective member 108.

Figure 5B:
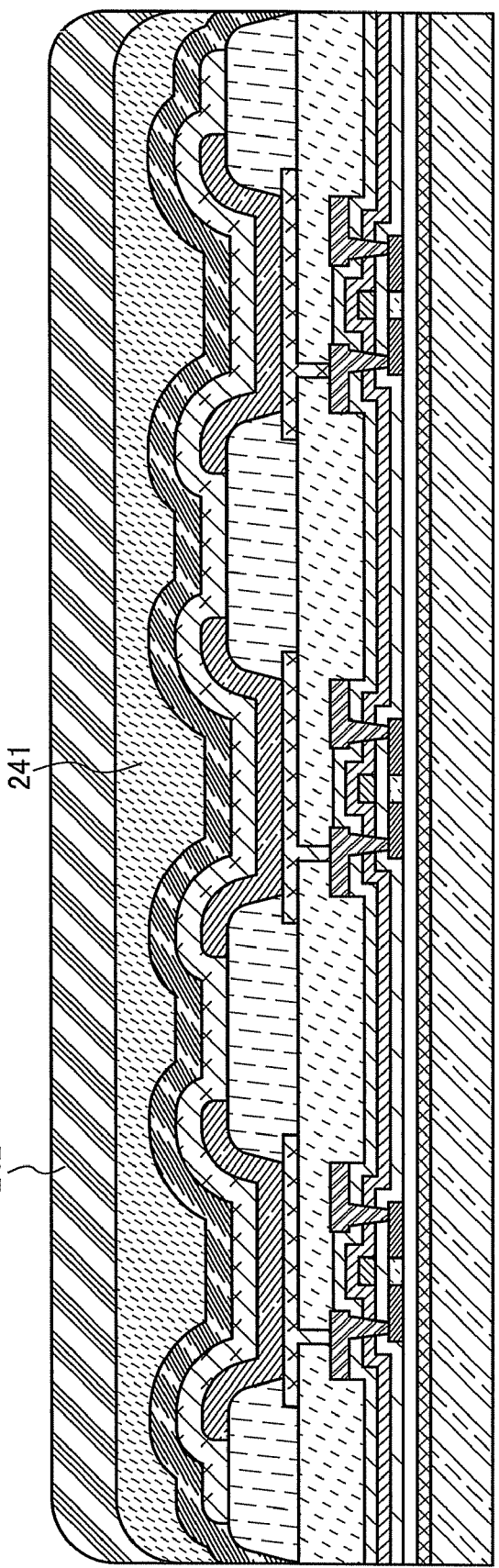

Further, a supporting member 242 is formed over the protective member 241 (FIG. 5B). The supporting member 242 may be formed using a material similar to that of the supporting member 109.

Figure 6A:
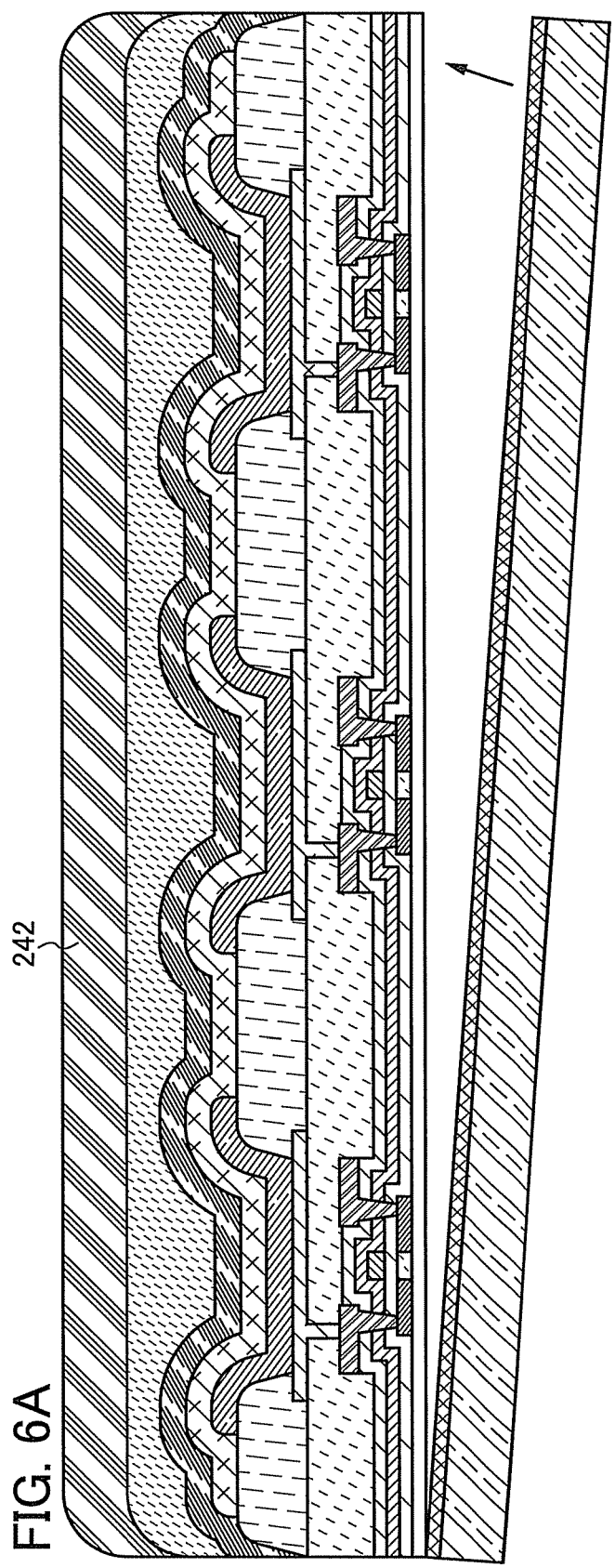
FIGS. 6A and 6B are cross-sectional views illustrating a manufacturing method of a light-emitting device.

Then, the base film 204, the TFTs 211, the insulating film 208, the electrodes 217, the partition wall 275, the organic material layers 112, the electrode 113, the sealing layer 114, the protective member 241, and the supporting member 242 are separated from the substrate 221 using the separation layer 222 (FIG. 6A).

At this time, irradiation with a laser beam, for example, a UV laser beam may be performed to form an opening in the separation layer 222 and the base film 204.

Part of the separation layer 222 is removed by formation of the opening, which enables the base film 204, the TFTs 211, the insulating film 208, the electrodes 217, the partition wall 275, the organic material layers 112, the electrode 113, the sealing layer 114, the protective member 241, and the supporting member 242 to be easily separated from the substrate 221. This separation occurs inside the separation layer 222 or at the boundary between the separation layer 222 and the base film 204.

In addition, the laser irradiation may be performed before the supporting member 242 is formed.

The kind of the laser beam is not limited to the LTV laser beam, and any laser beam can be used as long as it can form the opening.

A laser which emits a laser beam includes a laser medium, an excitation source, and a resonator. Lasers can be classified according to their media into a gas laser, a liquid laser, and a solid-state laser and can be classified according to their oscillation characteristics into a free electron laser, a semiconductor laser, and an X-ray laser. In this embodiment, any of these lasers may be used. Note that a gas laser or a solid-state laser is preferably used; in particular, a solid-state laser is more preferably used.

As a gas laser, there are a helium-neon laser, a carbon dioxide gas laser, an excimer laser, and an argon ion laser. An excimer laser includes a rare gas excimer laser and a rare gas halide excimer laser. A rare gas excimer laser oscillates by three kinds of excited molecules of argon, krypton, and xenon. An argon ion laser includes a rare gas ion laser and a metal vapor ion laser.

A liquid laser includes an inorganic liquid laser, an organic chelate laser, and a dye laser. In an inorganic liquid laser and an organic chelate laser, rare earth ions of neodymium or the like, which are utilized in a solid-state laser, are used as a laser medium.

A laser medium used in a solid-state laser is a solid-state base doped with active species functioning as a laser. The solid-state base is a crystal or glass. The crystal indicates YAG (an yttrium aluminum garnet crystal), YLF, $YVO_4$, $YAlO_3$, sapphire, ruby, or alexandrite. In addition, the active species functioning as a laser are, for example, trivalent ions (such as $Cr^{3+}$, $Nd^{3+}$, $Yb^{3+}$, $Tm^{3+}$, $Ho^{3+}$, $Er^{3+}$, or $Ti^{3+}$).

Further, when using ceramic (a polycrystal), a medium can be fowled to have a free shape for a short time at low cost. When using a single crystal, generally, a columnar medium with a diameter of several millimeters and a length of several tens of millimeters is used; however, in the case of using ceramic (a polycrystal), a medium with a larger size can be formed. The concentration of a dopant such as Nd or Yb in a medium which directly contributes to light emission cannot be changed largely either in a single crystal or in a polycrystal. Therefore, there is limitation to some extent on improvement of laser output by increasing the concentration. However, in the case of using ceramic as the medium, a drastic improvement of output can be achieved because the size of the medium can be significantly increased compared to that of a single crystal. Further, in the case of using ceramic, a medium with a parallelepiped shape or a rectangular parallelepiped shape can be easily formed. In the case of using a medium having such a shape, when oscillated light is made travel in a zig-zag manner inside the medium, a path of the oscillated light can be made long. Therefore, amplitude is increased and a laser beam can be emitted at high output. In addition, since a laser beam emitted from a medium having such a shape has a quadrangular shape in cross-section at the time of emission, it has an advantage over a circular beam in being shaped into a linear beam. By shaping the laser beam emitted as described above using an optical system, a linear beam having a length of less than or equal to 1 nm on a shorter side and a length of several millimeters to several meters on a longer side can be easily obtained. In addition, when a medium is uniformly irradiated with excited light, a linear beam is emitted with a uniform energy distribution in a long side direction. When a semiconductor film is irradiated with this linear beam, the entire surface of the semiconductor film can be uniformly annealed. In the case where uniform in annealing is required from one end to the other end of the linear beam, slits may be provided at the both ends of the linear beam so as to block an attenuated portion of energy, or the like.

As a laser beam for forming the opening, either a continuous wave (CW) laser beam or a pulsed laser beam can be used. The conditions for irradiation with the laser beam, such as a frequency, power density, energy density, and a beam profile, are controlled as appropriate in consideration of the thicknesses, the materials, and the like of the base film 204 and the separation layer 222.

Figure 16:
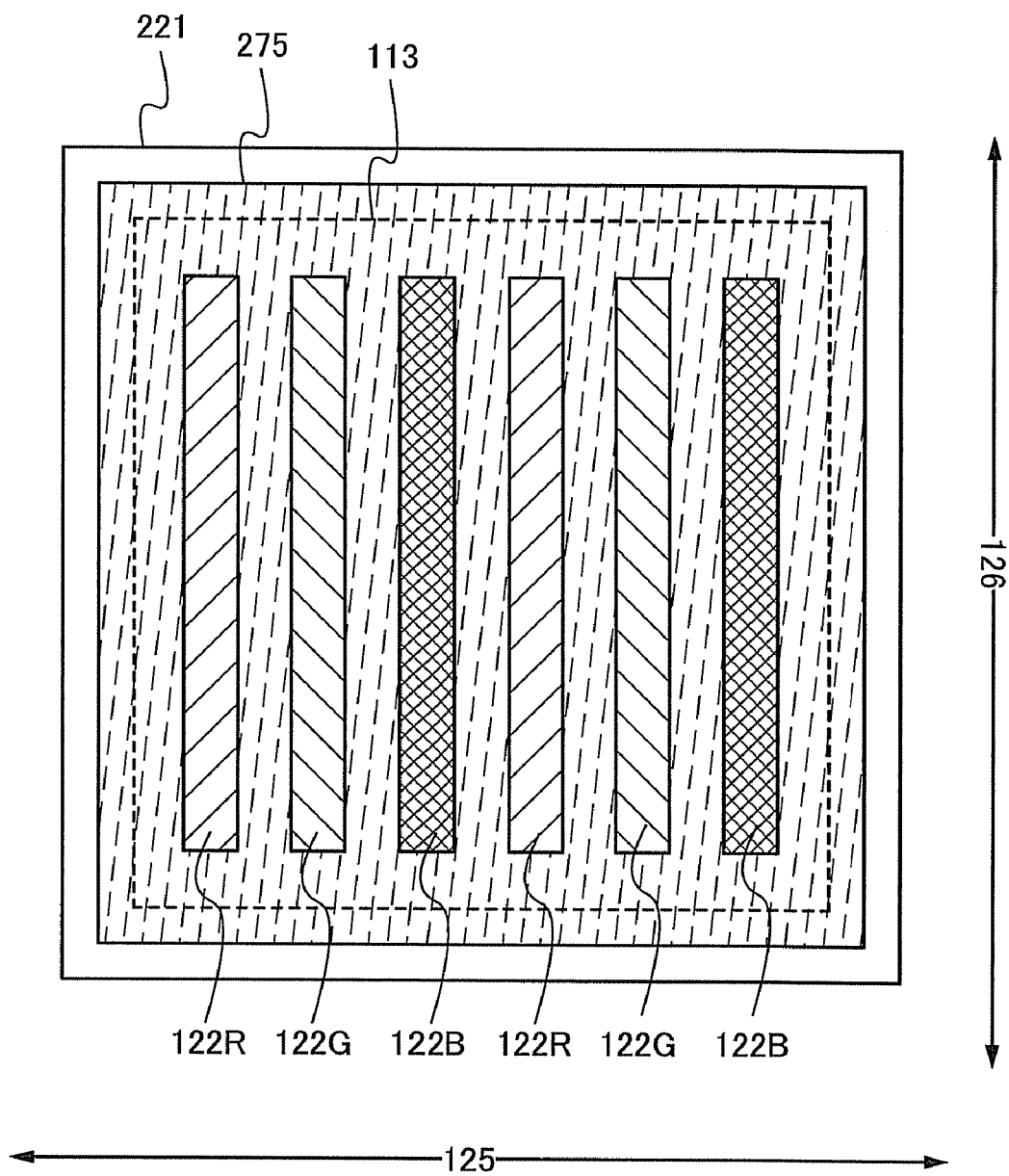
FIG. 16 is a top view illustrating a manufacturing method of a light-emitting device.
Figure 17:
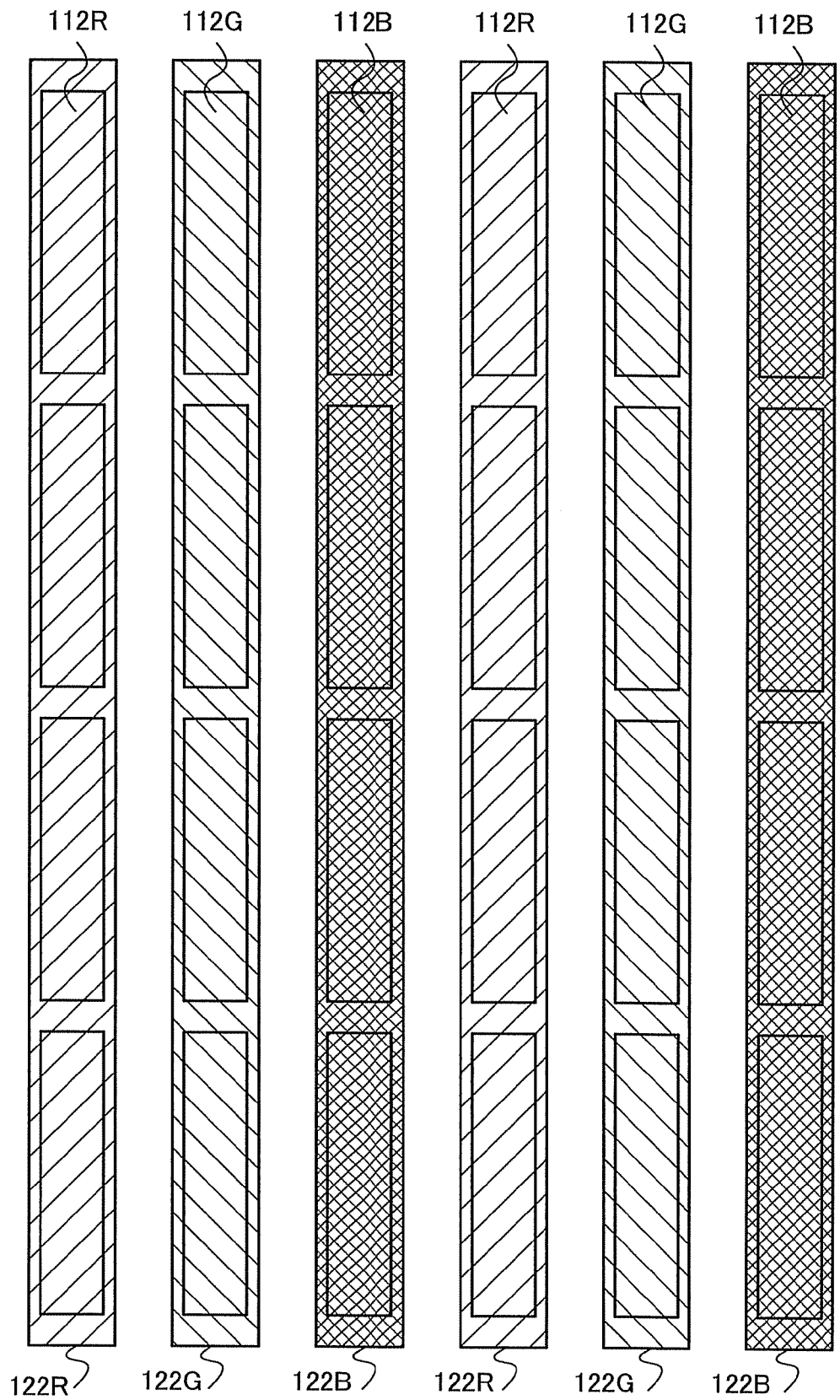
FIG. 17 is a top view illustrating a manufacturing method of a light-emitting device.

With reference to FIG. 16 and FIG. 17, a direction in which the substrate 221 and a stack structure body over the substrate 221 should be separated in the separation step is described.

FIG. 16 is a top view of the stack structure body illustrated in FIG. 5B. Note that FIG. 16 illustrates only the substrate 221, the partition wall 275, the electrode 113, a region 122R, a region 122G, and a region 122B. The region 122R, the region 122G, and the region 122B are described below.

The organic material layers 112 which emit light of the same color are arranged adjacent to each other in a line. A region where organic material layers 112R emitting red light are arranged is the region 122R, a region where organic material layers 112G emitting green light are arranged is the region 122G, and a region where organic material layers 112B emitting blue light are arranged is the region 122B (FIG. 17).

The partition wall 275 is placed in a region between the organic material layer 112R and the organic material layer 112G, a region between the organic material layer 112G and the organic material layer 112B, and a region between the organic material layer 112B and the organic material layer 112R. Further, as illustrated in FIG. 16, it can be said that the partition wall 275 extends in a direction in which the organic material layer 112R, the organic material layer 112G, and the organic material layer 112B extend.

In FIG. 16, a direction 125 is parallel to one side of the substrate 221 and perpendicular to the direction in which the region 122R, the region 122G, and the region 122B, which are collectively referred to as a region 122, extend. When the substrate 221 and the stack structure body over the substrate 221 are separated in the direction 125, force for separation is applied to the partition wall 275 and the region 122 alternately.

Although the adhesiveness between the electrode 113 and the region 122 including the organic material layers 112 is low, the adhesiveness between the electrode 113 and the partition wall 275 is high. Therefore, since a portion with a low adhesiveness and a portion with a high adhesiveness are alternately arranged, the electrode 113 and the region 122 can be prevented from being separated from each other in the separation step.

On the other hand, when the substrate 221 and the stack structure body over the substrate 221 are separated in a direction 126 in which the region 122R, the region 122G, and the region 122B extend, force for the separation is always applied to both the partition wall 275 and the region 122.

As a result, although the adhesiveness between the electrode 113 and the partition wall 275 is high, the adhesiveness between the electrode 113 and the region 122 is low; therefore, portions with a low adhesiveness are arranged continuously, and the electrode 113 and the region 122 could possibly be separated from each other.

Accordingly, a direction of the separation should be the direction 125 which is perpendicular to the direction in which the region 122 extends and in which the partition wall 275 and the region 122 are arranged alternately.

Figure 6B:
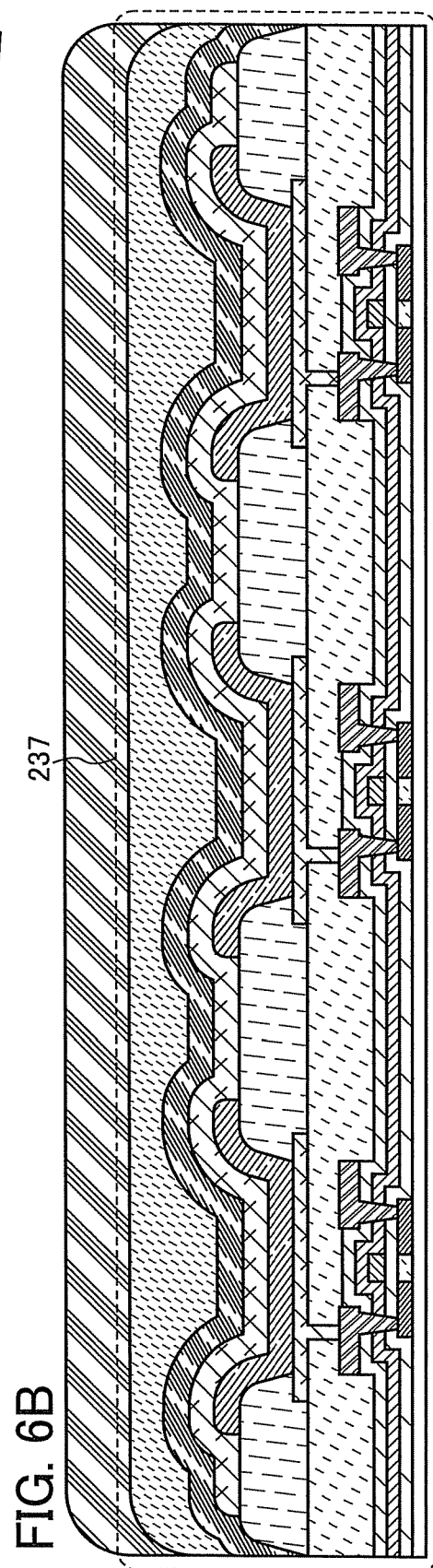

By separation of the substrate 221, a stack structure body 237 including the base film 204, the TFTs 211, the insulating film 208, the electrodes 217, the partition wall 275, the organic material layers 112, the electrode 113, the sealing layer 114, and the protective member 241 and the supporting member 242 can be obtained (FIG. 6B).

Figure 2:
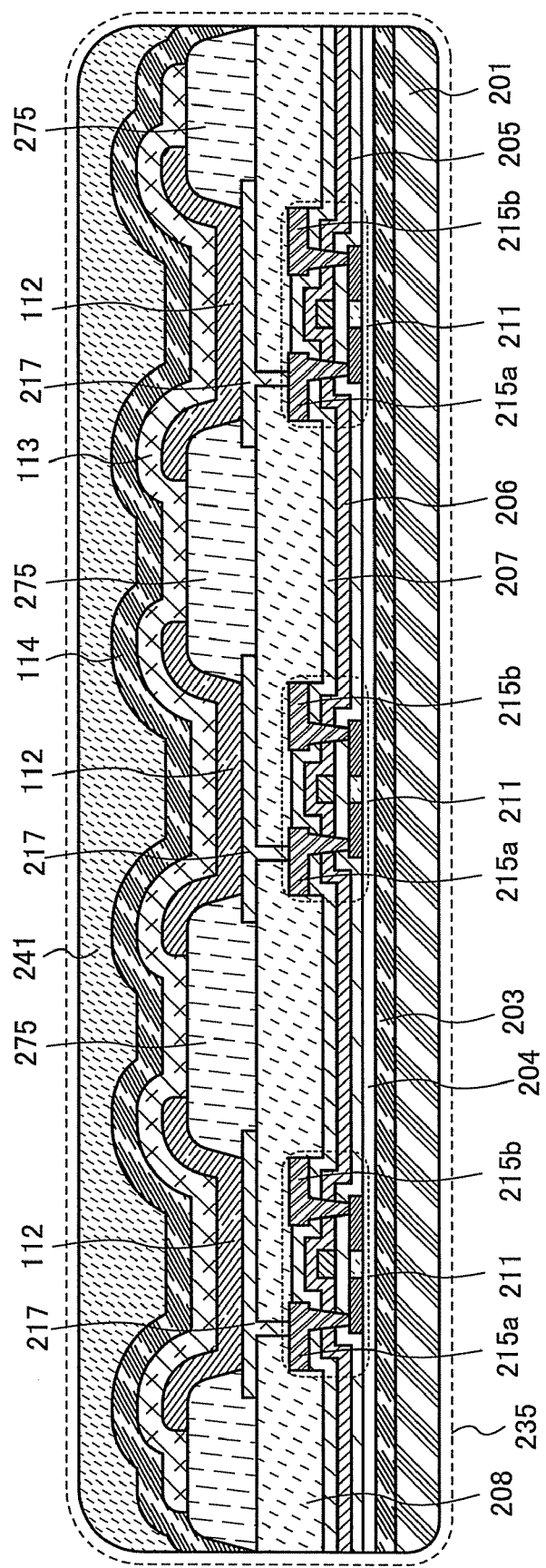
FIG. 2 is a cross-sectional view illustrating a manufacturing method of a light-emitting device.

A base 201 is attached to the base film 204 in the stack structure body 237. The base 201 may also be attached using an adhesive layer 203 (FIG. 2). The base 201 may be formed using a material similar to that of the base 111 or the structure body 305 illustrated in FIGS. 7A to 7C, FIG. 8, and FIG. 9. After that, the supporting member 242 is separated from the stack structure body 237.

For the adhesive layer 203, any of various types of curable adhesives, for example, a reactive curable adhesive, a thermosetting adhesive, a photocurable adhesive such as a UV curable adhesive, and an anaerobic adhesive, can be used. As examples of materials of such adhesives, an epoxy resin, an acrylic resin, a silicone resin, a phenol resin, and the like can be given.

As described above, since a contact area of the electrode 113 and the partition wall 275 is large, the electrode 113 and the organic material layer 112 can be prevented from being separated from each other in the separation step using the separation layer 222.

A light-emitting device 235 can be manufactured in the above manner.

Embodiment 2

In this embodiment, a mobile phone incorporating the light-emitting device described in Embodiment 1 will be described with reference to FIGS. 10A to 10D, FIGS. 11A and 11B, FIG. 12, FIG. 13, FIGS. 14A to 14D, and FIGS. 15A and 15B. In this embodiment, the same components are denoted by the same reference numerals.

Figure 10A:
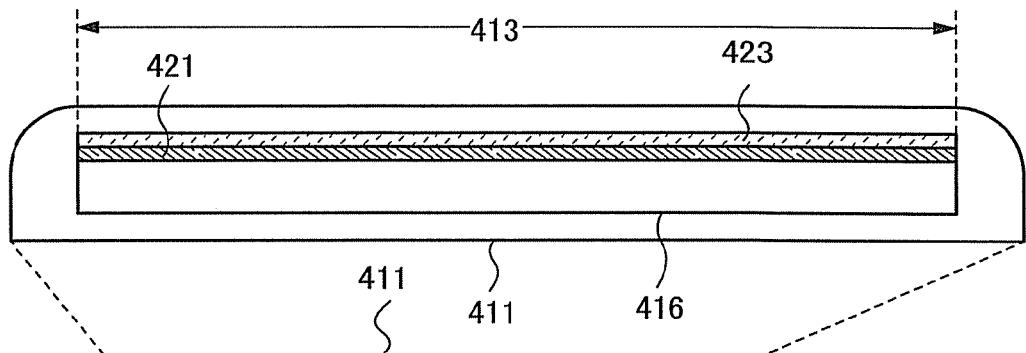
FIG. 10A is a cross-sectional view.
Figure 10B:
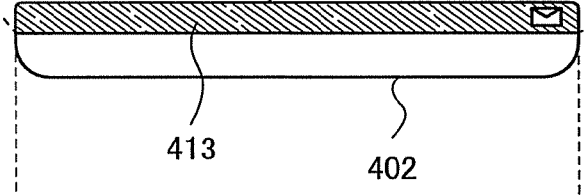
FIG. 10B is a top view.
Figure 10C:
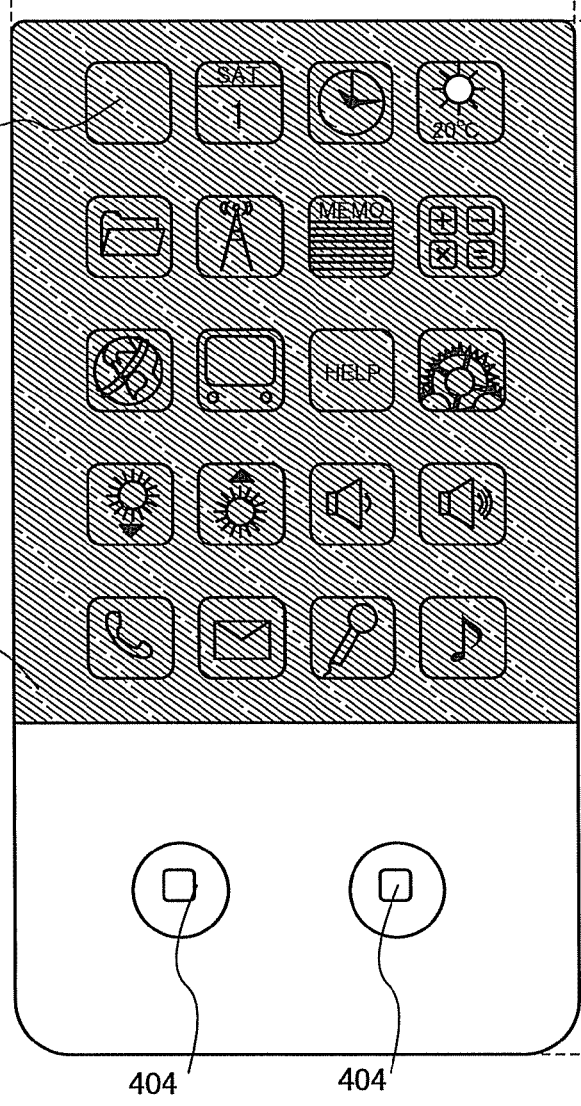
FIG. 10C is a front view.
Figure 10D:
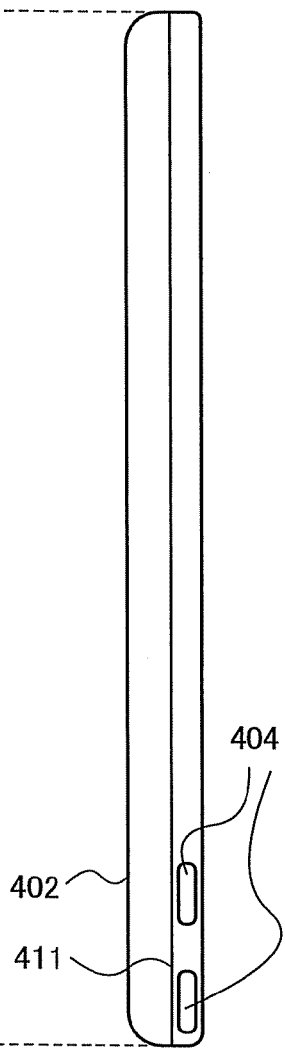
FIG. 10D is a side view, illustrating a mobile phone.

FIG. 10C is a front view of the mobile phone; FIG. 10D, a side view of the mobile phone; FIG. 10B, a top view of the mobile phone; and FIG. 10A, a cross-sectional view of a housing 411. The shape of the front of the housing 411 is a rectangle having longer sides and shorter sides, which may have round corners. In this embodiment, a direction parallel to the longer sides of the rectangle that is the shape of the front is referred to as a longitudinal direction, and a direction parallel to the shorter sides is referred to as a lateral direction.

In addition, the shape of the side of the housing 411 is also a rectangle having longer sides and shorter sides, which may have round corners. In this embodiment, a direction parallel to the longer sides of the rectangle that is the shape of the side is referred to as a longitudinal direction, and a direction parallel to the shorter sides is referred to as a depth direction.

The mobile phone illustrated in FIGS. 10A to 10D has the housing 411, a housing 402, and a display region 413, operation buttons 404, an EL panel 421, a touch panel 423, and a support 416 which are incorporated in the housing 411.

The EL panel 421 and a driver circuit 412 which is mentioned below may be formed using the light-emitting device described in Embodiment 1. The EL panel 421 is manufactured using a light-emitting element, and additionally a pixel circuit for driving the light-emitting element may be manufactured using a semiconductor circuit element. Further, the driver circuit 412 for driving the pixel circuit may also be manufactured using a semiconductor circuit element. A semiconductor circuit element is an element which is foamed using a semiconductor and has a circuit including a thin film transistor, a diode, and the like.

Figure 15A:
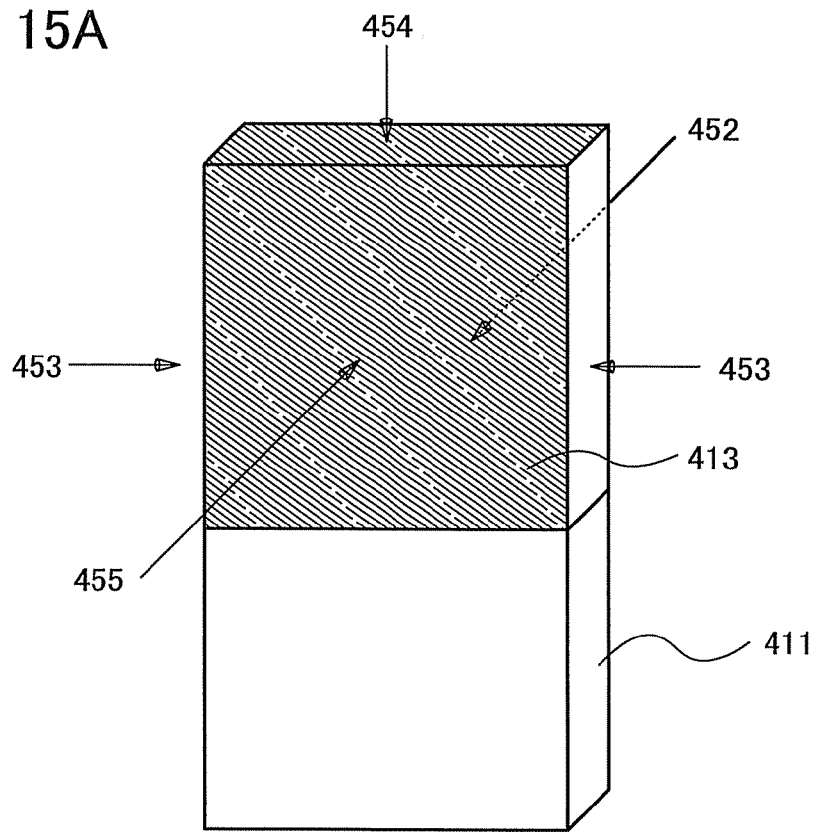
FIGS. 15A and 15B are perspective views each illustrating a mobile phone.

Note that FIG. 15A is a perspective view of the housing 411. A region of the housing 411 which has the largest area is a front 455; a surface opposite to the front 455 is a back 452; regions between the front 455 and the back 452 are sides 453; and one of regions surrounded by the front 455, the back 452, and the sides 453 is a top 454.

Figure 11A:
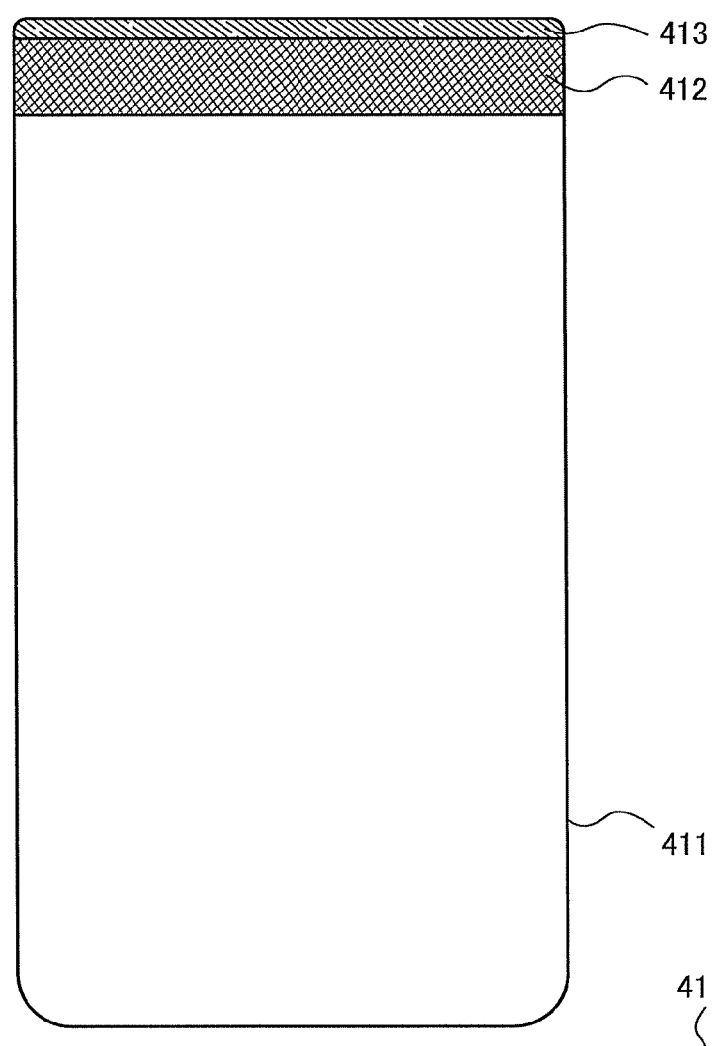
FIG. 11A is a back view and FIG. 11B is a top view, illustrating a mobile phone.

FIG. 11A is a back view of the mobile phone illustrated in FIGS. 10A to 10D.

As illustrated in FIG. 11A, the driver circuit 412 is manufactured so as to be located on the back 452 of the housing 411.

Figure 11B:
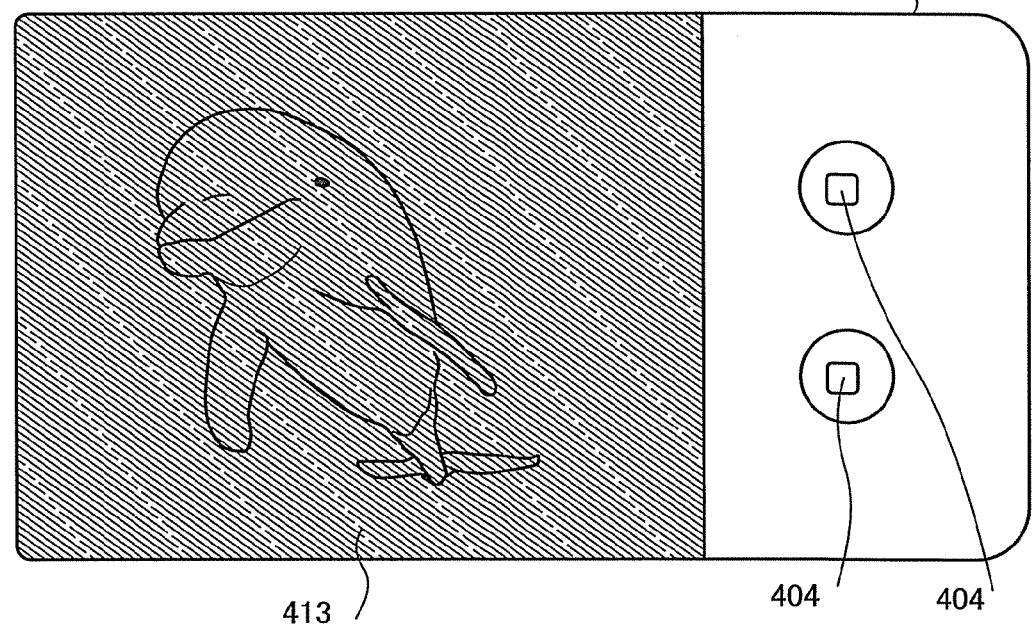

FIG. 11B is a top view of the mobile phone which is rotated 90° to the side from the orientation in FIG. 10C. Images and letters can be displayed, whether the mobile phone of this embodiment is placed horizontally or vertically for a landscape mode or a portrait mode.

As illustrated in FIG. 10A, the housing 411 includes the support 416, and the EL panel 421 is disposed on the support 416. Here, the EL panel 421 covers an upper region of the support 416.

In this manner, the display region 413 is present at an upper portion in the longitudinal direction of the mobile phone. In other words, the display region 413 is present on the top 454. Accordingly, when the mobile phone is put in, for example, a breast pocket, the display region 413 can be seen even if the mobile phone is not taken out of the pocket.

The display region 413 may be capable of displaying date, phone number, personal name, whether or not there is incoming e-mail or an incoming call, and the like. If necessary, display may be performed only in a region of the display region 413 which is on the top 454 and not performed in the other region, in which case energy saving can be achieved.

Figure 12:
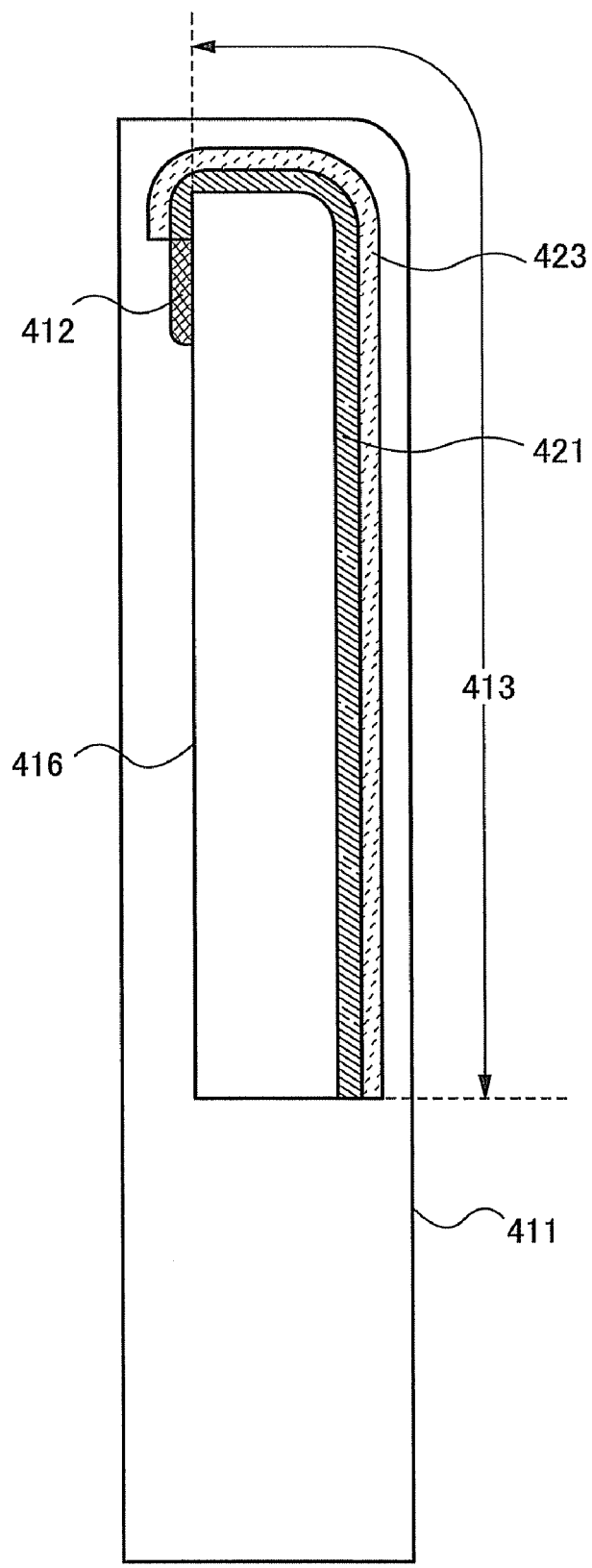
FIG. 12 is a cross-sectional view illustrating a mobile phone.

FIG. 12 is a cross-sectional view of FIG. 10D. As illustrated in FIG. 12, in the housing 411, the EL panel 421 and the touch panel 423 are disposed along the support 416, and the display region 413 is present on the front 455 and the top 454 of the housing 411.

Figure 13:
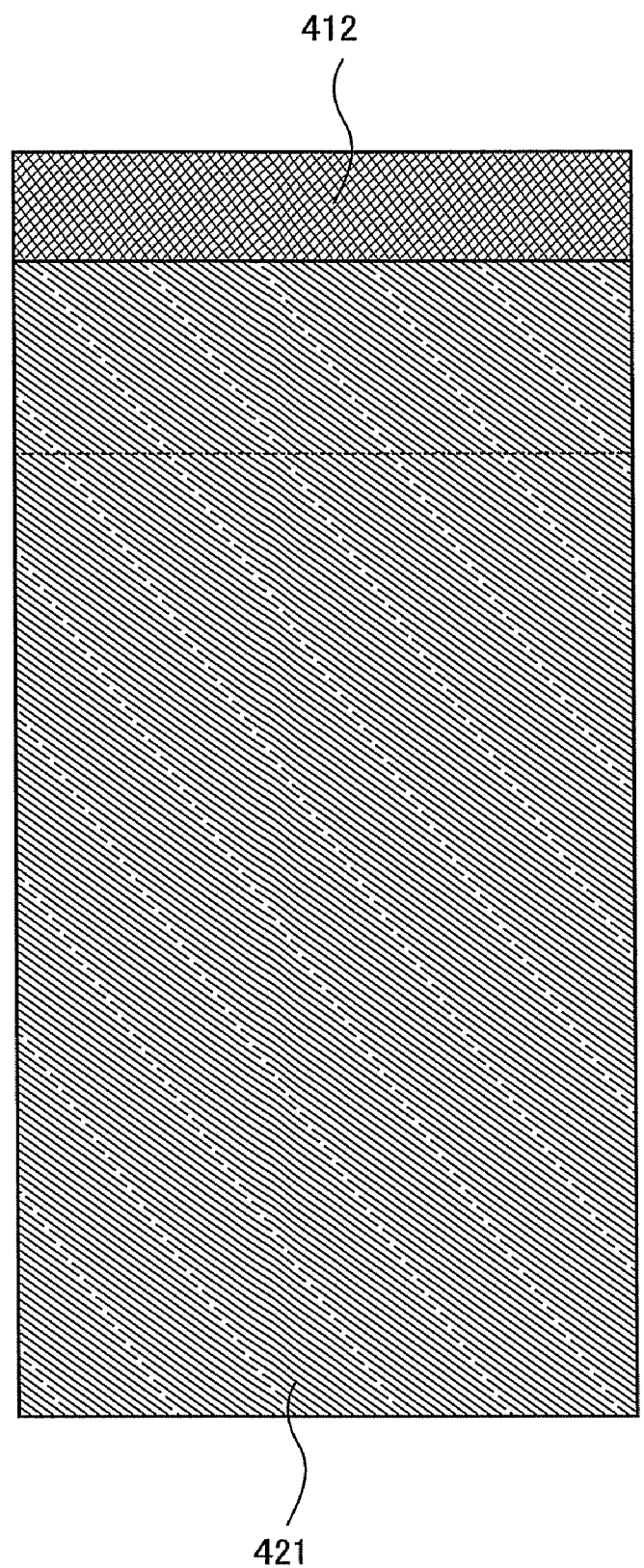
FIG. 13 is a development view illustrating an EL panel.

A development view of the EL panel 421 and the driver circuit 412 is illustrated in FIG. 13. In FIG. 13, the EL panel 421 is manufactured so as to be located on the top 454 and the back 452, and the driver circuit 412 is located on the back 452. In this manner, the EL panel 421 is manufactured so as to be located on both the front 455 and the top 454, not manufactured separately on the front 455 and the top 454. Thus, manufacturing cost and manufacturing time can be suppressed.

The touch panel 423 is disposed on the EL panel 421, and the display region 413 displays buttons 414 for the touch panel. By touching the buttons 414 with a finger or the like, contents displayed in the display region 413 can be controlled. Further, making a call or composing mail can be performed by touching the buttons 414 in the display region 413 with a finger or the like.

The buttons 414 for the touch panel 423 may be displayed when needed, and when the buttons 414 are not needed, images or letters can be displayed in the whole area of the display region 413 as illustrated in FIG. 11B.

Furthermore, an example of a mobile phone in which a display region 433 is present also at an upper portion in the longitudinal direction of the mobile phone and an upper longer side in a cross-section of the mobile phone also has a curvature radius is illustrated in FIGS. 14A to 14D and FIG. 15B.

FIG. 14C is a front view of the mobile phone; FIG. 14D, a side view of the mobile phone; FIG. 14B, a top view of the mobile phone; and FIG. 14A, a cross-sectional view of a housing 431. The shape of the front of the housing 431 is a rectangle having longer sides and shorter sides, which may have round corners. In this embodiment, a direction parallel to the longer sides of the rectangle is referred to as a longitudinal direction, and a direction parallel to the shorter sides is referred to as a lateral direction.

The mobile phone illustrated in FIGS. 14A to 14D has the housing 431, a housing 402, and the display region 433, operation buttons 404, an EL panel 441, a touch panel 443, and a support 436 which are incorporated in the housing 431.

The EL panel 441 and a driver circuit 412 may be formed using the light-emitting element and the semiconductor circuit element which are described in Embodiment 1. The EL panel 441 is manufactured using a light-emitting element, and additionally a pixel circuit for driving the light-emitting element may be manufactured using a semiconductor circuit element. The driver circuit 412 for driving the pixel circuit may also be manufactured using a semiconductor circuit element.

Figure 15B:
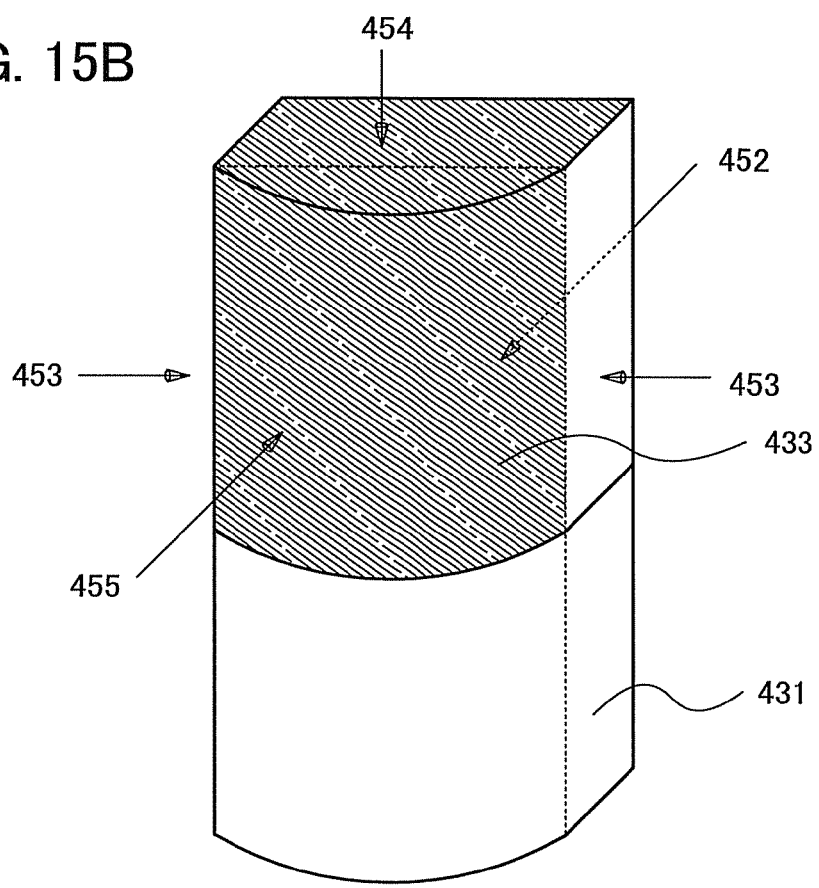

Note that FIG. 15B is a perspective view of the housing 431. As in FIG. 15A, a region of the housing 431 which has the largest area is a front 455; a surface opposite to the front 455 is a back 452; regions between the front 455 and the back 452 are sides 453; and one of regions surrounded by the front 455, the back 452, and the sides 453 is a top 454.

A back view of the mobile phone illustrated in FIGS. 14A to 14D is similar to FIG. 11A which is the back view of the mobile phone illustrated in FIGS. 10A to 10D.

As in FIG. 11A, the driver circuit 412 is manufactured so as to be located on the back 452 of the housing 431. The back view of the mobile phone illustrated in FIGS. 14A to 14D corresponds to a view in which the housing 411 in FIG. 11A is replaced with the housing 431.

In the mobile phone illustrated in FIGS. 14A to 14D, the support 436 is formed to have a cross-sectional shape in which an upper longer side has a curvature radius. Accordingly, the EL panel 441 and the touch panel 443 each have a cross-sectional shape in which an upper longer side has a curvature radius. In addition, an upper longer side of the housing 431 is also curved. In other words, the display region 433 on the front 455 is curved outwards.

When the upper longer side of the support 436 has a curvature radius R1, the curvature radius R1 is preferably 20 cm to 30 cm.

Because the upper longer side of the support 436 is curved with the curvature radius R1, the upper longer sides of the EL panel 441 covering the support 436, the touch panel 443 covering the EL panel 441, and the housing 431 are also curved.

In the mobile phone illustrated in FIGS. 14A to 14D, the display region 433 is present also at an upper portion in the longitudinal direction of the mobile phone. In other words, the display region 433 is present also on the top 454. Accordingly, when the mobile phone is put in, for example, a breast pocket, the display region 433 can be seen even if the mobile phone is not taken out of the pocket.

The display region 433 may be capable of displaying date, phone number, personal name, whether or not there is incoming e-mail or an incoming call, and the like. If necessary, display may be performed only in a region of the display region 433 which is on the top 454 and not performed in the other region, in which case energy saving can be achieved.

A development view of the EL panel 441 and the driver circuit 412 is similar to FIG. 13, which is the development view of those of the mobile phone illustrated FIGS. 10A to 10D, and corresponds to a view in which the EL panel 421 in FIG. 13 is replaced with the EL panel 441. In FIG. 13, the driver circuit 412 is located on the top 454 and the back 452.

This application is based on Japanese Patent Application serial no. 2009-075989 filed with Japan Patent Office on Mar. 26, 2009, the entire contents of which are hereby incorporated by reference.

What is claimed is:

1. A method for manufacturing a light-emitting device, comprising the steps of:
    forming a partition wall over a substrate, the partition wall including a plurality of stripe shaped portions extending along a first direction;
    forming an organic material layer emitting red light, an organic material layer emitting green light, and an organic material layer emitting blue light over the substrate in respective regions between the plurality of stripe shaped portions of the partition wall,
    forming an electrode over the organic material layers to be in contact with the partition wall, and
    separating a stack structure including the partition wall, the organic material layers, and the electrode from the substrate using a separation layer along a second direction perpendicular to the first direction and parallel to the substrate,
    wherein organic material layers emitting light of the same color are arranged adjacent to each other in a line and extend along the first direction.

2. The method for manufacturing a light-emitting device, according to claim 1,
    wherein the partition wall is formed using an inorganic material, and
    wherein the inorganic material is at least one of silicon oxide, silicon nitride, silicon oxide containing nitrogen, silicon nitride containing oxygen, and diamond-like carbon.

3. The method for manufacturing a light-emitting device, according to claim 1,
    wherein the partition wall is formed using an organic material, and
    wherein the organic material is at least one of polyimide, acrylic, polyamide, polyimide amide, resist, benzocyclobutene, and siloxane.

4. The method for manufacturing a light-emitting device, according to claim 1, wherein the electrode comprises a material selected from the group consisting of a light-transmitting anode, a light-transmitting cathode, a light-blocking cathode, and a light-blocking anode.

5. The method for manufacturing a light-emitting device, according to claim 4, wherein the light-transmitting anode comprises a material selected from the group consisting of indium oxide, an indium oxide-tin oxide alloy, indium oxide-tin oxide containing silicon or silicon oxide, indium oxide containing tungsten oxide and zinc oxide, an indium oxide-zinc oxide alloy, zinc oxide, and zinc oxide to which gallium (Ga) is added.

6. The method for manufacturing a light-emitting device, according to claim 4,
    wherein the light-blocking cathode comprises a material selected from the group consisting of lithium (Li), cesium (Cs), magnesium (Mg), calcium (Ca), strontium (Sr), europium (Eu), and ytterbium (Yb).

7. The method for manufacturing a light-emitting device, according to claim 4,
    wherein the light-blocking anode comprises a material selected from the group consisting of gold (Au), platinum (Pt), nickel (Ni), tungsten (W), chromium (Cr), molybdenum (Mo), iron (Fe), cobalt (Co), copper (Cu), and palladium (Pd).

8. A method for manufacturing a light-emitting device, comprising the steps of:
fowling a separation layer over a substrate;
forming a semiconductor circuit element layer over the separation layer;
forming a plurality of first electrodes electrically connected to the semiconductor circuit element layer over the semiconductor circuit element layer;
forming a partition wall overlapping with an end portion of each of the plurality of first electrodes over the semiconductor circuit element layer, the partition wall extending along a first direction;
forming an organic material layer emitting red light, an organic material layer emitting green light, and an organic material layer emitting blue light over the respective first electrodes,
forming a second electrode over the organic material layers to be in contact with the partition wall, and
separating a stack structure including the semiconductor circuit element layer, the first electrodes, the partition wall, the organic material layers, and the second electrode from the substrate using the separation layer along a second direction perpendicular to the first direction and parallel to the substrate,
wherein organic material layers emitting light of the same color are arranged adjacent to each other in a line,
wherein a first region where organic material layers emitting red light are arranged adjacent to each other in a line, a second region where organic material layers emitting green light are arranged adjacent to each other in a line, and a third region where organic material layers emitting blue light are arranged adjacent to each other in a line extend along the first direction, and
wherein the partition wall exists in a region between the first region and the second region, a region between the second region and the third region, and a region between the third region and the first region.

9. The method for manufacturing a light-emitting device, according to claim 8,
wherein the partition wall is formed using an inorganic material, and
wherein the inorganic material is at least one of silicon oxide, silicon nitride, silicon oxide containing nitrogen, silicon nitride containing oxygen, and diamond-like carbon.

10. The method for manufacturing a light-emitting device, according to claim 8,
wherein the partition wall is formed using an organic material, and
wherein the organic material is at least one of polyimide, acrylic, polyamide, polyimide amide, resist, benzocyclobutene, and siloxane.

11. The method for manufacturing a light-emitting device, according to claim 8, wherein the second electrode comprises a material selected from the group consisting of a light-transmitting anode, a light-transmitting cathode, a light-blocking cathode, and a light-blocking anode.

12. The method for manufacturing a light-emitting device, according to claim 11, wherein the light-transmitting anode comprises a material selected from the group consisting of indium oxide, an indium oxide-tin oxide alloy, indium oxide-tin oxide containing silicon or silicon oxide, indium oxide containing tungsten oxide and zinc oxide, an indium oxide-zinc oxide alloy, zinc oxide, and zinc oxide to which gallium (Ga) is added.

13. The method for manufacturing a light-emitting device, according to claim 11,
wherein the light-blocking cathode comprises a material selected from the group consisting of lithium (Li), cesium (Cs), magnesium (Mg), calcium (Ca.), strontium (Sr), europium (Eu), and ytterbium (Yb).

14. The method for manufacturing a light-emitting device, according to claim 11,
wherein the light-blocking anode comprises a material selected from the group consisting of gold (Au), platinum (Pt), nickel (Ni), tungsten (W), chromium (Cr), molybdenum (Mo), iron (Fe), cobalt (Co), copper (Cu), and palladium (Pd).

* * * * *

UNITED STATES PATENT AND TRADEMARK OFFICE
CERTIFICATE OF CORRECTION

PATENT NO. : 8,372,668 B2  
APPLICATION NO. : 12/729487  
DATED : February 12, 2013  
INVENTOR(S) : Kaoru Hatano, Takaaki Nagata and Takuya Tsurume Page 1 of 1

It is certified that error appears in the above-identified patent and that said Letters Patent is hereby corrected as shown below:

In the specification:

Column 4, Line 31; Change "faun" to --form--.  
Column 4, Line 49; Change "fanned" to --formed--.  
Column 9, Line 36; Change "(DCJTB)" to --(DCJTI)--.  
Column 11, Line 59; Change "with R, and B." to --with R, G, and B.--.  
Column 15, Line 16; Change "geranium" to --germanium--.  
Column 17, Line 6; Change "LTV" to --UV--.  
Column 17, Line 38; Change "fowled" to --formed--.  
Column 17, Line 63; Change "1 nm" to --1 mm--.  
Column 18, Line 3; Change "uniform in annealing" to --uniform annealing--.  
Column 19, Line 66; Change "foamed" to --formed--.

In the claims:

Column 23, Line 6, claim 8; Change "fowling" to --forming--.

Signed and Sealed this  
Seventh Day of May, 2013

Teresa Stanek Rea  
*Acting Director of the United States Patent and Trademark Office*